(12) United States Patent
Ouellet et al.

(10) Patent No.: US 7,682,860 B2
(45) Date of Patent: Mar. 23, 2010

(54) PROTECTION CAPSULE FOR MEMS DEVICES

(75) Inventors: Luc Ouellet, Granby (CA); Veronique Giard, Canton de Granby (CA); Sylvie Archambault, Granby (CA); Paul Ignatiuk, Westmount (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 403 days.

(21) Appl. No.: 11/687,287

(22) Filed: Mar. 16, 2007

(65) Prior Publication Data

US 2007/0231943 A1    Oct. 4, 2007

Related U.S. Application Data

(60) Provisional application No. 60/783,829, filed on Mar. 21, 2006.

(51) Int. Cl.
*H01L 21/00* (2006.01)

(52) U.S. Cl. ............... 438/50; 438/51; 438/52; 438/53; 438/458

(58) Field of Classification Search ............ 438/50, 438/51, 52, 53, 125, 455, 456, 458, 464
See application file for complete search history.

(56) References Cited

U.S. PATENT DOCUMENTS

| | | | | |
|---|---|---|---|---|
| 5,904,545 | A * | 5/1999 | Smith et al. ............. | 438/455 |
| 6,576,151 | B1 * | 6/2003 | Vereecke et al. ......... | 438/715 |
| 7,208,392 | B1 * | 4/2007 | Jaussaud et al. ......... | 438/455 |
| 2006/0211163 | A1 * | 9/2006 | Ouellet et al. ........... | 438/50 |

* cited by examiner

*Primary Examiner*—Kevin M Picardat
(74) *Attorney, Agent, or Firm*—Marks & Clerk; Richard J. Mitchell

(57) ABSTRACT

A method of making a MEMS device is disclosed wherein anhydrous HF exposed silicon nitride is used as a temporary adhesion layer to permit the transfer of a layer from a carrier substrate to a receiving substrate.

16 Claims, 16 Drawing Sheets

Fig. 17
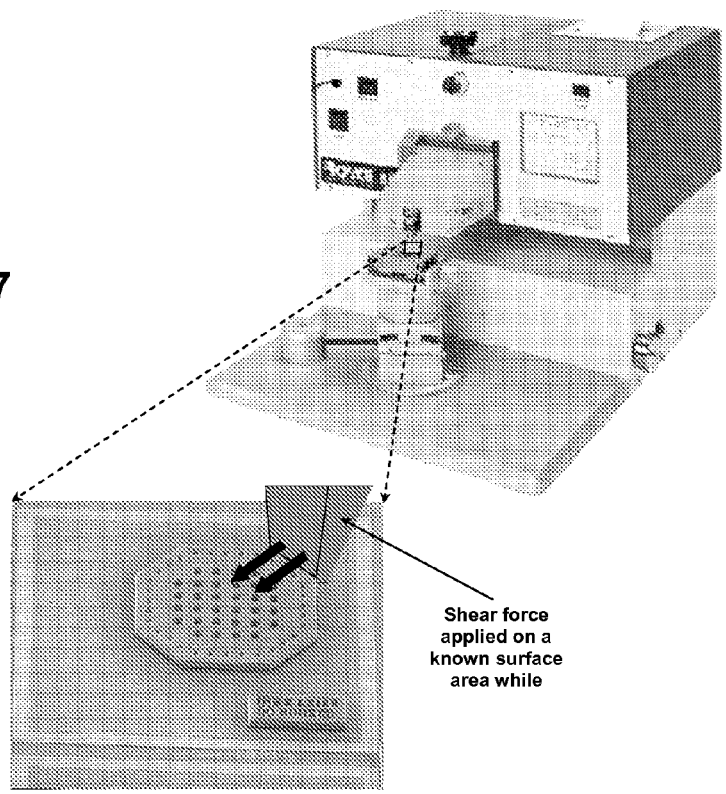
Shear force applied on a known surface area while
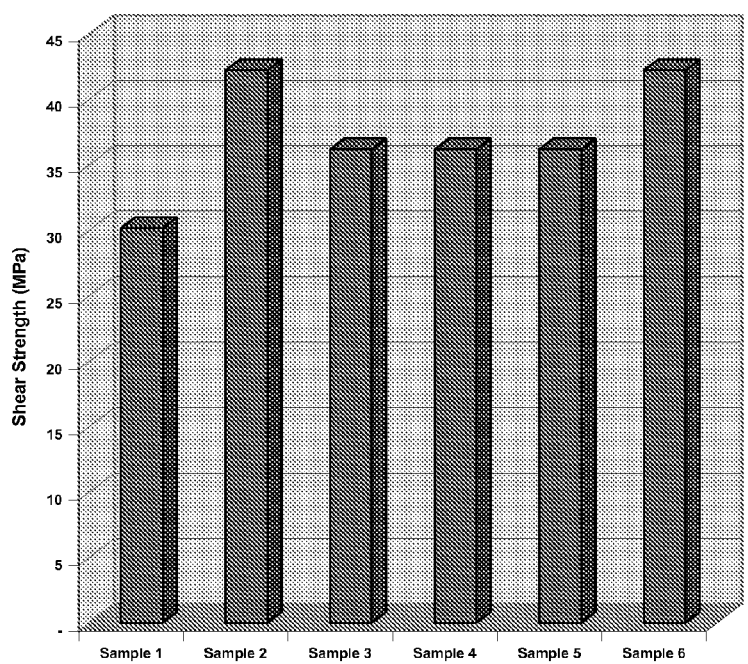
Fig. 18

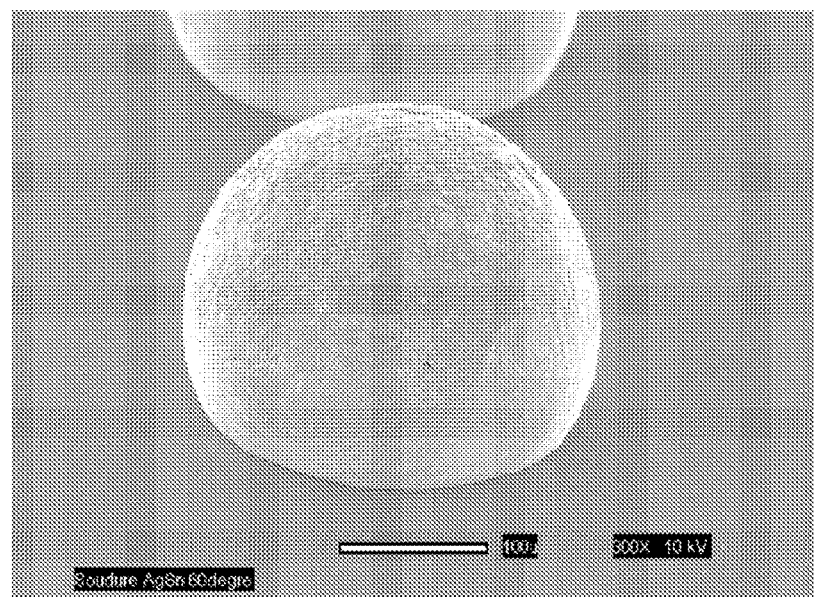
Fig. 19
Fig. 20
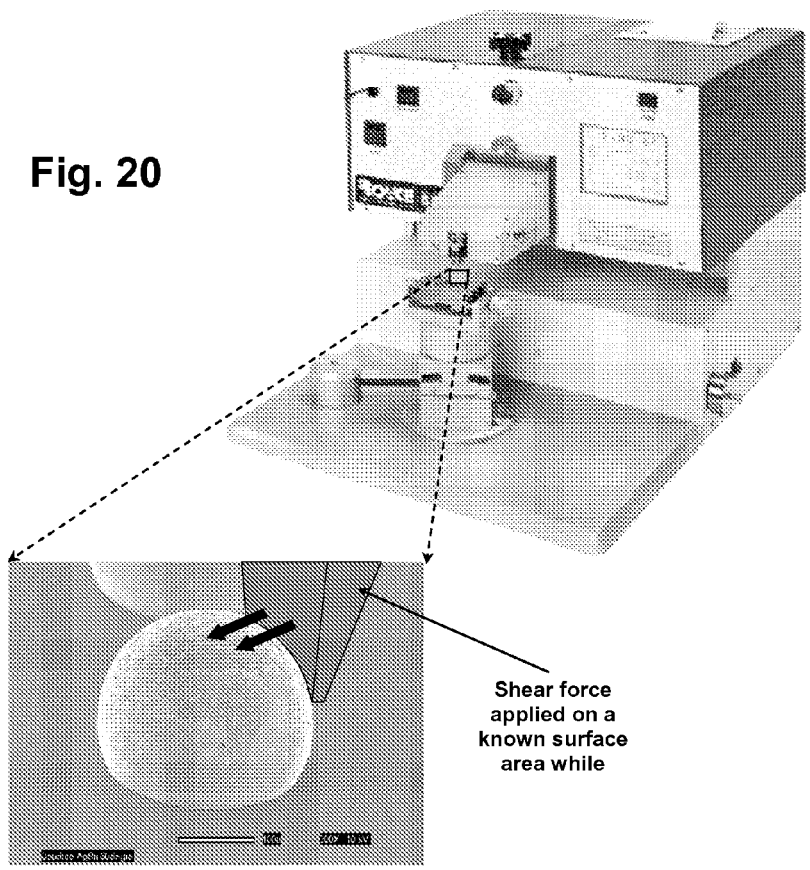
Shear force applied on a known surface area while

PROTECTION CAPSULE FOR MEMS DEVICES

CROSS REFERENCE TO RELATED APPLICATION

This application claims the benefit of U.S. provisional patent application No. 60/783,829, filed Mar. 21, 2006, the contents of which are herein incorporated by reference.

FIELD OF THE INVENTION

This invention relates to the manufacture of Micro-Electro-Mechanical-Systems (MEMS) such as microphones, micro-mirrors, micro-actuators, micro-sensors and other such micro-devices.

BACKGROUND OF THE INVENTION

MEMS devices integrating thousands of complex and very sensitive free-to-move components integrating digital and/or analog CMOS control logic and/or high voltage CMOS drivers are used in many fields, such as performing sensing and/or actuation functions for consumer electronics, automotive and other high volume and low cost MEMS applications.

The integration of free-to-move mechanical devices that are in direct with ambient atmosphere creates a very serious challenge because these devices are typically very fragile and require a protective cover that protects against atmospherics debris. This protective cover needs to be integrated after these mechanical devices have been made free-to-move, thus preventing the use of the popular sacrificial layer approach that would become in direct physical contact with these free-to-move mechanical devices. Moreover, the protective cover needs to be integrated using low temperature processing because in most cases, these free-to-move mechanical devices cannot experience a high temperature exposure because of the various thermal coefficients of expansion of their constituting materials. A maximum exposure temperature of about 250° C. is typical for such sensitive MEMS devices.

Various methods are known in the prior art for making the protective layer. A first example involves the use of a sacrificial layer. A first example of a process to fabricate such a protection capsule is shown in U.S. Pat. No. 6,635,503. This process requires a "sacrificial layer" to be deposited over the free-to-move mechanical devices and under the protection capsule. Unfortunately this sacrificial material approach cannot be used because this sacrificial material would need to become in physical contact with the free-to-move mechanical devices, thus causing mechanical issues and possibly destruction of the free-to-move mechanical devices. Additional examples of such an approach are the following Prior Art documents: U.S. Pat. No 5,322,594 titled: "Manufacture of a One Piece Full Width Ink Jet Printing Bar and U.S. Pat. No. 6,902,656 titled: "Fabrication of Microstructures with Vacuum Sealed Cavities A second approach involves the use of a frit glass. An example of such a process to fabricate such a protection capsule is shown in FIG. 1. This process uses a precision screen to deposit a slurry comprising organic materials and a frit glass containing filler onto the protection capsule. Following screen printing and heating to a high enough temperature to volatilize the organic materials, the protection cap is contacted and pressed against the MEMS wafer while heating to a high temperature preferably about 350° C.-475° C. as to exceed the softening point of the frit glass material and allow the thermo-compression bonding of the protection cap onto the MEMS wafer in such a way that no frit glass touches the free-to-move mechanical devices upon contact. Unfortunately, such a bond temperature of about 350° C.-475° C. exceeds the maximum temperature requirement of about 250° C. of such sensitive MEMS devices. Examples of such an approach are the following Prior Art documents:

- U.S. Pat. No. 5,323,051 titled 'Semiconductor wafer level package';
- U.S. Pat. No. 6,465,281 titled 'Method of manufacturing a semiconductor wafer level package';
- Gary Li, Ampere A. Tseng, 'Low stress packaging of a micromachined accelerometer', IEEE Transactions on electronics packaging manufacturing, Vol. 24, No. 1, January 2001;

A third approach for fabricating such a protection capsule involves anodic bonding of the protection capsule. This process requires the sodium atoms of the protection capsule made of sodium-based silica glass (such as Corning Glass 'Pyrex™ 7740) to be diffused at a temperature of about 350-450° C. and under a high electrical field created by a negative voltage of about 1000-2000V applied between the Pyrex™ protection capsule and the MEMS wafer incorporating the free-to-move mechanical devices as to allow sodium displacement of the silicon atoms of the Pyrex™ protection capsule and the anodic bonding to the MEMS wafer. Unfortunately, the anodic bond temperature of about 350° C.-475° C. again exceeds the maximum temperature requirement of about 250° C. of such sensitive MEMS devices. More, the sodium being an undesirable mobile ion inducing threshold voltage shifts of CMOS and high-voltage CMOS devices the use of anodic bonding is to be avoided for the production of complex MEMS micro-devices are formed by integrating very sensitive free-to-move mechanical devices, digital and/or analog CMOS control logic and/or high voltage CMOS drivers capable of performing sensing and/or actuation functions. An example of such an approach is disclosed in U.S. Pat. No. 5,952,572 titled 'Angular rate sensor and acceleration sensor' (Matsushita Electric Industrial Co., Ltd.)

A fourth example of a process to fabricate such a protection capsule involving eutectic bonding is disclosed in U.S. Pat. No. 5,668,033. This process requires the bonding of a previously machined cover wafer onto the MEMS wafer using gold-silicon or gold-polysilicon eutectic bonding at a temperature of more then about 360° C. Again, such a bond temperature exceeds the maximum temperature requirement of about 250° C. of such sensitive MEMS devices. More, such an eutectic bonding approach imposes the use of gold, a material proscribed in CMOS manufacturing facilities where complex MEMS micro-devices are formed by integrating very sensitive free-to-move mechanical devices, digital and/or analog CMOS control logic and/or high voltage CMOS drivers capable of performing sensing and/or actuation functions.

A fifth example of a process to fabricate such a protection capsule involving soldering, brazing or direct metal bonding is shown in U.S. Pat. No. 6,297,072. This process requires the soldering of a first wafer to a second wafer integrating a MEMS device by soldering, brazing or direct metal bonding the protection capsule to the MEMS wafers integrating the free-to-move mechanical devices. This technique requires suitable solderable under-bump metals (UBM), brazing metal patterns or planarized metal patterns to be present on the protection capsule and on the MEMS wafer integrating the free-to-move mechanical devices as to allow the soldering, brazing or direct metal bonding. Although possible, this technique involves more steps and is a more complex and expensive process that the one presented in the following patent application. Additional examples of such an approach are shown in:

U.S. Patent Application 20040067604 titled: 'Wafer level packaging technique for microdevices'

U.S. Patent Application 20050142685 titled: 'Hermetic wafer-level packaging for MEMS devices with low-temperature metallurgy'

U.S. Patent Application 20050161795 titled: 'Room Temperature Direct Wafer Bonding'

A sixth example of a process to fabricate such a protection capsule, involving photopolymer bonding, is shown in U.S. Pat. No. 5,907,333. This process requires a photosensitive polymer to be spun-on onto the wafer integrating the free-to-move mechanical devices before being exposed and developed as to form a basis onto which a machined protection capsule is bonded. Unfortunately this approach cannot be used because this spin-on photopolymer would need to become in physical contact with the free-to-move mechanical devices, thus causing mechanical issues and possibly desctuction of the free-to-move mechanical devices. Additional examples of such an approach are shown in:

U.S. Pat. No. 6,193,359 titled: 'Ink Jet Print Head Containing a Radiation Curable Resin Layer'

F. Niklaus, P. Enoksson, P. Griss, E. Kälvesten and G. Stemme, 'Low-Temperature Wafer-Level Transfer Bonding', Journal of Microelectromechanical Systems, Vol. 10, No. 4, December 2001, pp. 525-531

J. Oberhammer and G. Stemme, 'Contact printing for improved bond-strength of patterned adhesive full-wafer bonded 0-level packages', 17th IEEE International Conference on Micro Electro Mechanical Systems, Maastricht, The Netherlands, Jan. 25-29, 2004, pp. 713-716

A seventh example of a process to fabricate such a protection capsule involving a monolithic photopolymer is shown in U.S. Pat. No. 5,458,254. This process agains require a photosensitive polymer to be spin-on directly onto the wafer integrating the free-to-move mechanical devices before being exposed and developed. Unfortunately this direct spin-on approach cannot be used because this spin-on photopolymer would need to become in physical contact with the free-to-move mechanical devices, thus causing mechanical issues and possibly destruction of the free-to-move mechanical devices. Additional examples of such an approach are shown in:

U.S. Pat. No. 6,162,589 titled: 'Direct Imaging Polymer Fluid Jet Orifice'

U.S. Pat. No. 6,303,274 titled: 'Ink Chamber and Orifice Shaoe Variations in an Ink-Jet Orifice Plate'

U.S. Pat. No. 6,305,790 titled: 'Fully Integratable Thermal InkJet Printhead Having Multiple Ink Feed Holes per Nozzle'

U.S. Pat. No. 6,336,714 titled: 'Fully Integratable Thermal InkJet Printhead Having Thin Film Layer Shelf'

U.S. Pat. No. 6,419,346 titled: 'Two-Step Trench Etch for a Fully Integrated Thermal InkJet Printhead'

U.S. Pat. No. 6,447,102 titled: 'Direct Imaging Polymer Fluid Jet Orifice'

U.S. Pat. No. 6,450,622 titled: 'Fluid Ejection Device'

U.S. Pat. No. 6,454,393 titled: 'Chamber and Orifice Shape Variations in an Orifice Plate'

U.S. Pat. No. 6,481,832 titled: 'Fluid-Jet Ejection Device'

U.S. Pat. No. 6,517,735 titled: 'Ink Feed Trench Etch Technique for a Fully Integrated Thermal Inkjet Printhead'

U.S. Pat. No. 6,520,627 titled: 'Direct Imaging Polymer Fluid Jet Orifice'

U.S. Pat. No. 6,520,628 titled: 'Fluid Ejection Device With Substrate Having a Fluid Firing Device and a Fluid Reservoir on a First Substrate Thereof'

U.S. Pat. No. 6,527,368 titled: 'Layer With Discontinuity Over Fluid Slot'

U.S. Pat. No. 6,543,884 titled: 'Fully Integratable Thermal InkJet Printhead Having Etched Back PSG Layer'

U.S. Pat. No. 6,626,523 titled: 'Printhead Having a Thin Film Membrane With a Floating Section'

An eighth example of a process to fabricate such a protection capsule involving the transfer technique using wax is shown in FIG. 2. This process requires the protection capsule to be first bonded to a CARRIER wafer using a low temperature wax. Then, a photosensitive benzocyclobutene, BCB, is spun-on, exposed and developed as to define a bond pattern. Then the BCB of the protection capsule is properly aligned and bonded to the MEMS wafer integrating the free-to-move mechanical devices. Then the wax of the CARRIER wafer is heated above its melting point as to detach the BCB bonded protection capsule to the MEMS wafer integrating the free-to-move mechanical devices. This protection capsule transfer technique is very interesting because it prevents a direct physical contact of the BCB with the free-to-move mechanical devices, and because the polymer bonding (250° C.) and the wax de-bonding (150° C.) are both performed at temperatures lower then the maximum temperature requirement of about 250° C. for such sensitive MEMS devices. This technique requires a lot of processing (Wax coating/drying on a CARRIER wafer+BCB coating/exposure/develop over wax+BCB align/bond on MEMS wafer+Wax de-bonding bonding. More, it limits the protection capsule to a monolith that prevents the definition of individual protection capsules on the individual free-to-move mechanical devices of the MEMS wafers. Typical MEMS wafers may contain a few thousand MEMS devices when these target consumer electronics, automotive and other high volume and low cost applications. In that case, the transferred monolithic protection capsule defining cavities above the individual free-to-move mechanical devices of the MEMS wafers yet does not provide the thousands of individual protection capsules above the thousands of individual free-to-move mechanical devices of the MEMS wafers. More processing of the monolith (such as wet etching, dry etching or precision sawing) is then required to achieve this goal. The present patent application provides a much simpler and much less expensive technique to achieve this goal of providing individual protection capsules above the individual free-to-move mechanical devices of the MEMS wafers. An example of such an approach in shown in the following Prior Art document:

A. Jourdain, X. Rottenberg, G. Carchon and H.A.C. Tilmanstitled, 'Optimization of 0-Level Packaging for RF-MEMS Devices', Transducers 2003, The 12th International Conference on Solid State Sensors, Actuators and Microsystems, Boston, Jun. 8-12, 2003, pp. 1915-1918

A ninth example of a process to fabricate such a protection capsule using a transferred parylene membrane is shown in FIG. 3, where step a illustrates the carrier wafer; step b the deposit a sacrificial layer; step c the deposit of parylene on sacrificial layer; step d the patterning of parylene to expose sacrificial layer; step e the removal of the sacrificial layer to suspend parylene; step f the deposition of parylene on a MEMS wafer; step g the alignment and bonding of a suspended parylene layer to MEMS wafer's parylene layer; and step h the detachment of the MEMS wafer from the carrier.

The parylene layer is transferred to MEMS wafer. This particular process uses a carrier wafer coated with 1.3 um of AZ1813 sacrificial photoresist over which a 0.38 um thick layer of parylene is deposited and patterned as to expose the underlying layer of parylene. Following local etch of the exposed parylene the underlying sacrificial photoresist is dissolved in acetone as to leave a free-standing pattern of parylene on the carrier wafer. The patterned MEMS wafer integrating the free-to-move mechanical devices is coated with another layer of 0.38 um thick layer of parylene and is aligned and pressed against the free standing pattern of parylene on the carrier wafer while heating at 230° C. under a vaccum of $1.5*10^{-4}$ Torr. The two parylene layers will polymerize together and will result in a bond strength of 3.6 MPa. This transferred parylene process is undesirable because the poor stiffness of the 0.38 um thick free-standing pattern of parylene on the CARRIER wafer only allows small sizes membranes to be transferred. More, one of the 0.38 um thick layer of parylene comes in physical contact with the free-to-move mechanical devices, thus causing mechanical issues and possibly desctuction of the free-to-move mechanical devices. Finally the achieved bond strength of 3.6 MPa is not high enough for many MEMS applications. An example of such an approach in shown in the following Prior Art document:

H. S. Kim and K. Najafi, 'Wafer Bonding Using Parylene and Wafer-Level Transfer of Free-Standing Parylene Membranes', Transducers 2003, The 12th International Conference on Solid State Sensors, Actuators and Microsystems, Boston, Jun. 8-12, 2003, pp. 790-793

SUMMARY OF THE INVENTION

The present invention relates to new, simple, inexpensive, high precision, stiction-free, gold-free, sodium-free and potassium-free process allowing the simultaneous transfer, at a temperature of less then 250° C., of thousands of millimeter size free-standing protection capsules on MEMS wafers integrating thousands of complex and very sensitive free-to-move mechanical devices integrating digital and/or analog CMOS control logic and/or high voltage CMOS drivers capable of performing sensing and/or actuation functions for consumer electronics, automotive and other high volume and low cost MEMS applications. This new membrane transfer process uses a layer of silicon nitride exposed to anhydrous hydrofluoric acid as the temporary adhesion layer between a carrier wafer and the thousands of photolithographically defined protection capsules to be bonded above the very sensitive free-to-move mechanical devices to the MEMS wafer. It avoids a direct physical contact between the protection capsules with the free-to-move mechanical devices themselves, thus preventing potential mechanical issues and their possible destruction. It also allows the protection capsule to achieve a bond strength of more then 30 MPa.

According to the present invention there is provided a method of making a MEMS device wherein anhydrous HF exposed silicon nitride is used as a temporary adhesion layer to permit the transfer of a layer from a carrier substrate to a receiving substrate.

The carrier substrate may, for example, be a silicon carrier wafer; a glass carrier wafer; a compound semiconductor carrier wafer; a ceramic carrier wafer; or a metal carrier wafer.

The silicon nitride may be deposited by Low Pressure Chemical Vapour Deposition, LPCVD in a horizontal or vertical furnace; at a temperature ranging from 750° C. to 900° C. and preferably about 830° C.

The LPCVD silicon nitride may be deposited using a mixture of dichlorisilane, $SiH_2Cl_2$ and ammonia, $NH_3$ at a thickness ranging from 0.05 μm to 1.0 um, preferably about 0.3 um.

Alternatively, the silicon nitride may be deposited by Plasma Enhanced Chemical Vapour Deposition, PECVD wherein the PECVD equipment is batch equipment or single wafer equipment at a temperature ranging from 200° C. to 500° C., preferably about 400° C. and using a mixture of silane, $SiH_4$ and ammonia, $NH_3$.

The PECVD silicon nitride may be deposited at a thickness ranging from 0.05 μm to 1.0 μm of about 0.3 μm. The exposure of silicon nitride to anhydrous HF modifies the surface of the silicon nitride. The result of this modification is the transformation of the surface of silicon nitride to a compound, such as ammonium fluorosilicate that undergoes a transformation at low temperature. The transformation of ammonium fluorosilicate at 100° C. results in the loss of silicon tetrafluoride and the formation ammonium bifluoride.

The anhydrous HF process may be performed in a sub-atmospheric pressure of anhydrous HF where the sub-atmospheric pressure ranges from 10 to 750 Torr, preferably about 70 Torr.

The anhydrous HF process may be performed in a sub-atmospheric pressure mixture of anhydrous HF and an organic volatile such as methanol, acetone, 1-buthanol, 2-buthanol, 1-propanol or 2-propanol.

The layer of the carrier substrate may be a photopolymer, such as a negative tone photopolymer, where the negative tone photopolymer is an epoxy-like negative tone photopolymer, and in particular one of the NANO SU-8 series from MicroChem Corporation, such as SU-8 2005; SU-8 2010; SU-8 2025; SU-8 2050; SU-8 2100.

Alternatively, the epoxy-like negative tone photopolymer may be one of the GM or GLM SU-8 series from Gerstel Ltd, such as: GM1040; GM1060; GM1070, GLM2060, GLM3060;

The epoxy-like negative tone photopolymer may be one of the XP KMPR-1000 SU8 series from Kayaku Microchem Corporation, such as: XP KMPR-1005; XP KMPR-1010; XP KMPR-1025; XP KMPR-1050; XP KMPR-1100.

In one embodiment, the carrier substrate may be a combination of two layers of photopolymers, where the second photopolymer is also a negative tone photopolymer, and the negative tone photopolymer is an epoxy-like negative tone photopolymer.

The epoxy-like negative tone photopolymer may be one of the NANO SU-8 series from MicroChem Corporation; such as: SU-8 2005; SU-8 2010; SU-8 2025; SU-8 2050; SU-8 2100;

Alternatively, the epoxy-like negative tone photopolymer may be one of the GM or GLM SU-8 series from Gerstel Ltd, such as: GM1040; GM1060; GM1070, GLM2060, GLM3060.

The epoxy-like negative tone photopolymer may be one of the XP KMPR-1000 SU8 series from Kayaku Microchem Corporation, such as: XP KMPR-1005; XP KMPR-1010; XP KMPR-1025; XP KMPR-1050; XP KMPR-1100.

The thickness of the photopolymer thickness may range between 5 μm and 500 μm, preferably about 40 μm.

The second photopolymer may range in thickness between 5 μm and 500 μm, preferably about 10 μm.

The photopolymer or the combination of two layers of photopolymers should be strong enough to become a protection capsule, in particular a raised protection capsule.

The photopolymer may be exposed using a UV source, such as a broadband UV source (g-line, h-line and I-line). The broadband UV source may be highly collimated to achieve high aspect ratio features.

The exposed photopolymer should be subjected to a post-exposure heat treatment not exceeding 99° C. so that the exposed and heat treated photopolymer can be developed as to form a protection capsule.

The second photopolymer can also be exposed using a UV source, such as a broadband UV source (g-line, h-line and I-line), which may also be highly collimated so as to achieve high aspect ratio features;

The second exposed photopolymer may be subjected to a post-exposure heat treatment not exceeding 99° C., where the second exposed and heat treated photopolymer is developed as to form a spacer ring.

The first and second exposed and heat treated photopolymers can be developed together so as to simultaneously form a protection capsule underlying a spacer ring, which is subjected to a post-develop bake again not exceeding 99° C. The developed spacer ring and underlying protection capsule may also be simultaneously subjected to a post-develop bake again not exceeding 99° C.

The receiving substrate may be a silicon carrier wafer; a glass carrier wafer; a compound semiconductor carrier wafer; a ceramic carrier wafer; a metal carrier wafer; or a MEMS wafer.

The MEMS wafer may contains thousands of MEMS devices and the carrier substrate may contain thousands of protection capsules.

The transfer may be performed by flipping the carrier wafer containing thousands of protection capsules over the MEMS wafer containing thousands of MEMS devices. The flipped-over carrier wafer may contain thousands of protection capsules precisely aligned to the MEMS wafer containing thousands of MEMS devices.

The flipped-over and aligned carrier wafer to the MEMS wafer may be maintained in position while loaded in a wafer bonder. The two aligned wafers in the wafer bonder may be brought into physical contact by slowly pressing one against the other.

The two aligned wafers may be brought into physical contact with the thousands of protection capsules of the carrier wafer (separated from the thousands of spacer rings) without making any direct contact to the thousands of free-to-move mechanical devices of the MEMS wafer as to permanently bond the thousands of photopolymer spacer rings to the exposed top bond material of the MEMS wafer.

The physical contact may be effected by applying a force from 5 kN to 20 kN. The applied force of 5 kN to 20 kN may be applied to the effective surface area of the full 150 mm wafers (175 cm$^2$), thus resulting in an effective applied pressure of 0.5 MPa to 1.1 MPa.

The applied force of 5 kN to 20 kN may be applied to the effective surface area of the thousands of protection capsules, representing about 20% of the area of the full 150 mm wafers (35 cm$^2$), thus resulting in an effective applied pressure of 1.4 MPa to 5.7 MPa.

The applied force of 5 kN to 20 kN may be applied to the effective surface area of the thousands of spacer rings underneath the thousands of protection capsules, representing about 4% of the area of the full 150 mm wafers (7.0 cm$^2$), thus resulting in an effective applied pressure of 6.7 MPa to 29 MPa;

The force of 5 kN to 20 kN may be applied while heating the two wafers at a temperature not exceeding 95° C.

The heating may be performed for about 20 minutes so as to produce a permanent bond between the contacted photopolymer of the carrier wafer to the exposed top bond material of the MEMS wafer.

The bonded pair of wafers are separated outside the vacuum environment;

The separation may be performed at a temperature exceeding 100° C., resulting in the thermal decomposition of the ammonium fluorosilicate of the carrier wafer.

The thermal decomposition of the ammonium fluorosilicate of the carrier wafer may causes the formation of volatile gases and result in the spontaneous mechanical release of the carrier wafer from the MEMS wafer, thus leaving the thousands of photopolymer protection capsules and spacer rings bonded to the exposed top bond material of the MEMS wafer.

The volatile gases may be silicon tetrafluoride and ammonia.

The separated MEMS wafer may be exposed to a vacuum lower than 100 Pa at a temperature of up to 200° C. for up to four hours to polymerize the transferred protection capsules and to allow these to convert into a series of hard and very adherent epoxy-like protection capsules.

The adhesion may be characterized by a shear strength of about 30 MPa, which is about the adhesion of a lead-free solder on an under bump metal.

In another aspect the invention provides a method of making a MEMS device with a protection capsule, comprising forming a temporary adhesion layer on a carrier substrate; patterning the protection capsule on the temporary adhesion layer; bonding the protection capsule to a receiving substrate by applying pressure to the carrier substrate; and decomposing the temporary adhesion layer to release the carrier substrate.

BRIEF DESCRIPTION OF THE DRAWINGS

The invention will now be described in more detail, by way of example only, with reference to the accompanying drawings, in which:

FIG. 17 illustrates a Royce System 552 shear tester used to determine the shear strength of six transferred protection capsules onto the MEMS wafer;

FIG. 18 shows the shear strength measurements for six different protection capsules transferred to the MEMS wafer using the present invention;

FIG. 19 shows one the six AgSn micro-balls soldered onto Al/Ni/Pd UBM used to verify the measurements with the Royce System 552 shear tester8 shows the shear strength of six transferred protection capsules onto the MEMS wafer;

FIG. 20 shows the Royce System 552 shear tester used to determine the shear strength of six AgSn micro-balls onto Al/Ni/Pd UBM;

DETAILED DESCRIPTION OF THE PREFERRED EMBODIMENTS

Figure 1:
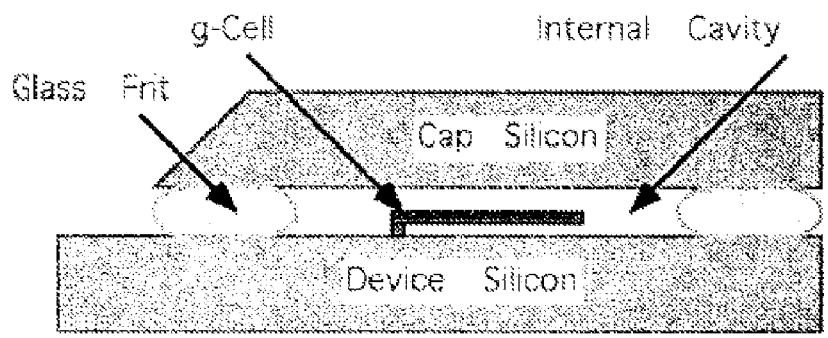
FIG. 1 illustrates a method of making a protective layer using a frit glass.
Figure 2:
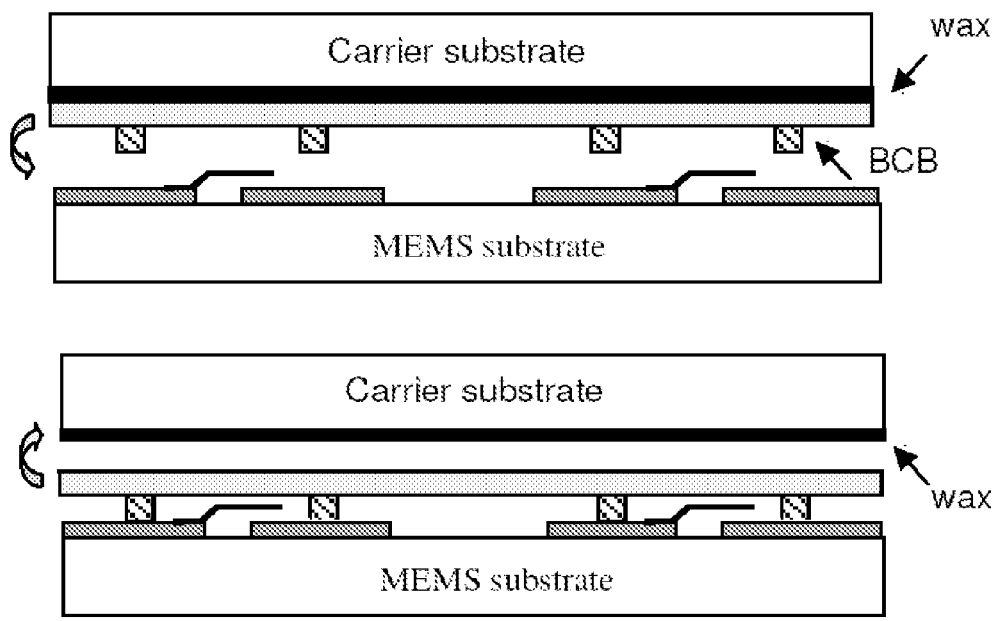
FIG. 2 illustrates a method of making a protective layer using a low temperature wax.
Figure 3:
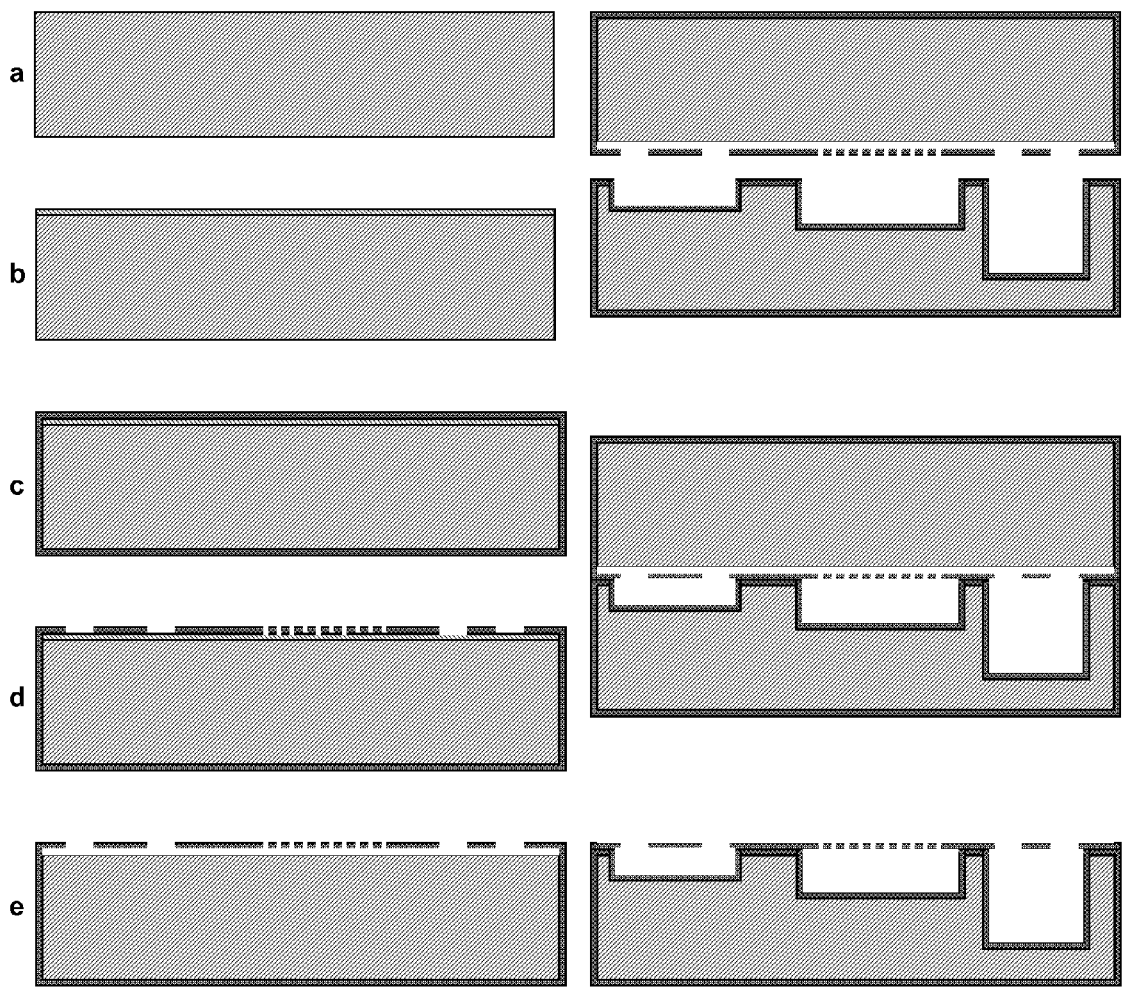
FIG. 3 shows a method of making a protective layer using a transferred parylene membrane.

A system for exposing a layer of silicon nitride, $Si_3N_4$, to an anhydrous hydrofluric acid is known. This exposure results in the transformation of the silicon nitride layer into a layer of ammonium fluorosilicate, $(NH_4)_2SiF_6$, and in the evaporation of silicon tetrafluoride, $SiF_4(g)$:

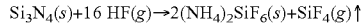

$$Si_3N_4(s)+16\ HF(g) \rightarrow 2(NH_4)_2SiF_6(s)+SiF_4(g)\uparrow$$

The following documents are cited as references to this anhydrous HF process typically used for the stiction-free release of advanced MEMS devices integrating sensitive mechanical parts prone to stiction:

R. S. Blackwood, R. L. Biggerstaff, L. D. Clements, R. Cleavelin, "Gaseous Process and Apparatus for Removing Films from Substrates", U.S. Pat. No. 4,749,440, Jun. 7, 1988;

J. Ruzyllo, K. Torek, C. Draffon, R. Grant, R. Novak, "Etching of Thermal Oxides in Low Pressure Anhydrous HF/CH₃OH Gas Mixtures at Elevated Temperatures", J. Electrochem Soc., Vol. 140, No. 4, April 1993, pp. L64-L66;

U.S. Pat. No. 5,439,553, "Controlled Etching of Oxides via Gas Phase reactions", Aug. 8, 1995;

K. Torek, J. Ruzyllo, R. Grant, R. Novak, "Reduced Pressure Etching of Thermal Oxides in Anhydrous HF/Alcoholic Gas Mixtures", J. Electrochem Soc., Vol. 142, No. 4, April 1995, pp. 1322-1326;

C. S. Lee, J. T. Baek, H. J. Yoo, S. E. Woo, "Modeling and Characterization of Gas-Phase Etching of Thermal Oxide and TEOS Oxide Using Anhydrous HF and CH₃OH", J. Electrochem Soc., Vol. 143, No. 3, March 1996. pp. 1099-1103;

H. H. Chung, W. I. Jang, C. S. Lee, J. H. Lee, H. J. Yoo, "Gas-phase Etching of TEOS and PSG Sacrificial Layers using Anhydrous HF and CH₃OH", Journal of the Korean Physical Society, Vol. 30, No. 3, June 1997, pp. 628-631;

J. H. Lee, W. I. Jang, C. S. Lee, Y. I. Lee, C. A. Choi, J. T. Baek, H. J. Yoo, "Characterization of Anhydrous HF Gas-Phase Etching with CH₃OH for Sacrificial Oxide Removal", Sensors and Actuators, A64, 1998, pp. 27-32;

B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620);

A. Witvrouw, B. Du Bois, P. De Moor, A. Verbist, C. Van Hoof, H. Bender, K. Baert, "A comparison between wet HF etching and vapor HF etching for sacrificial oxide removal", Proc. SPIE Micromachining and Microfabrication Process Technology VI; September 2000, Vol. 4174, 2000, pp. 130-141;

A. J. Muscat, A. G. Thorsness, G. Montano-Miranda, "Characterization of Residues Formed by Anhydrous Hydrogen Fluoride Etching of Doped Oxides", J. Vac. Sci. Technol. A19(4), July-August 2001, pp. 1854-1861;

W. I. Jang, C. A. Choi, M. L. Lee, C. H. Jun, Y. T. Kim, "Fabrication of MEMS Devices by Using Anhydrous HF Gas-phase Etching With Alcoholic Vapor", Journal of Micromechanics and Microengineering, 12, 2002, pp. 297-306;

K. Shimaoka, J. Sakata, "A New Full-Dry Processing Method for MEMS", R&D Review of Toyota CRDL Vol. 37 No. 3, September 2002, pp. 59-66;

M. A. Lester, "Selective Material Removal for Nanostructure Formation", Semiconductor International, Jun. 1, 2003

Figure 4A:
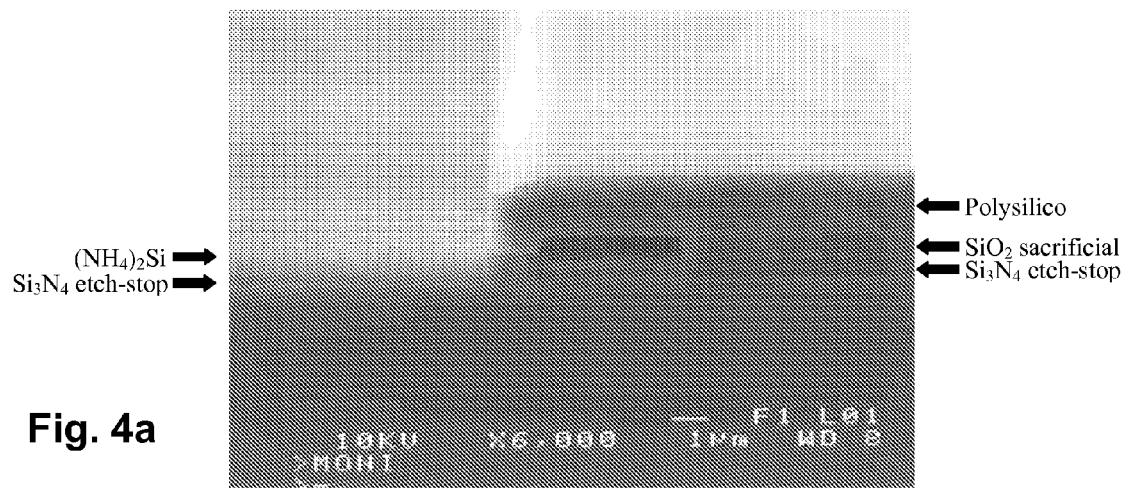
FIGS. 4a and 4b show Secondary Emission Microscopy, SEM, pictures of the chemical attack of silicon nitride by anhydrous HF.
Figure 4B:
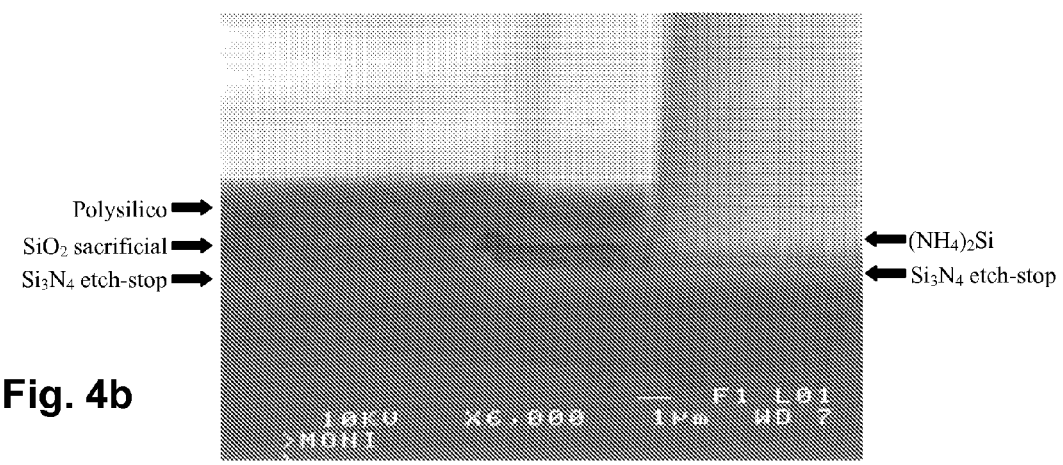

FIGS. 4a and 4b show Secondary Emission Microscopy, SEM, pictures of the chemical attack of silicon nitride by anhydrous HF. In these SEM pictures the silicon nitride layer was used as an etch-stop layer underneath a sacrificial layer of silicon oxide.

Figure 5:
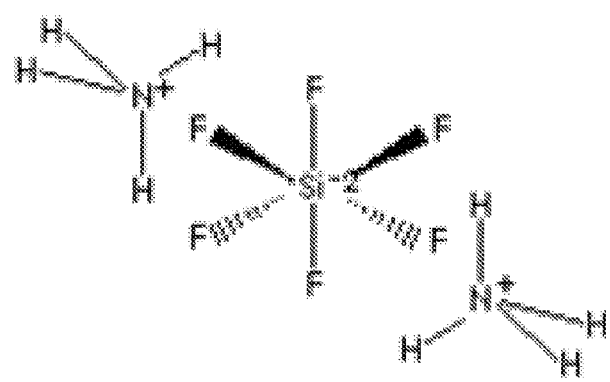
FIG. 5 shows the chemical structure of the ammonium fluorosilicate, $(NH_4)_2SiF_6$, compound resulting from the chemical attack of silicon nitride by anhydrous HF.

FIG. 5 shows the chemical structure of the ammonium fluorosilicate, $(NH_4)_2SiF_6$, compound resulting from the chemical attack of silicon nitride by anhydrous HF. Ammonium fluorosilicate is also known as ammonium fluosilicate, ammonium hexafluorosilicate, ammonium silicofluoride, bararite, cryptohalite, cryptophthalite, and diammonium hexafluorosilicate.

It is known from the Material Safety Data Sheet of ammonium fluorosilicate, $(NH_4)_2SiF_6(s)$:

"MSDS of Ammonium Fluorosilicate", LCl, Ltd., P.O. Box 49000, Jacksonville Beach, Fla. 32240-9000, http://www.lciltd.com/msds%5Cmsdsasf.htm http://fluoridealert.com/pesticides/ammonium.fluosilicate.msds.htm;

that the formed ammonium fluorosilicate, $(NH_4)_2SiF_6(s)$, is thermally unstable and experiences a thermal decomposition which provoke the evaporation of gas phase silicon tetrafluoride, $SiF_4(g)\uparrow$, and gas phase ammonia, $NH_3(g)\uparrow$, and results in the formation of an ammonium bifluoride, $NH_4HF_2(s)$, surface at a temperature of more than 100° C.:

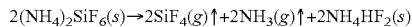

Figure 6:
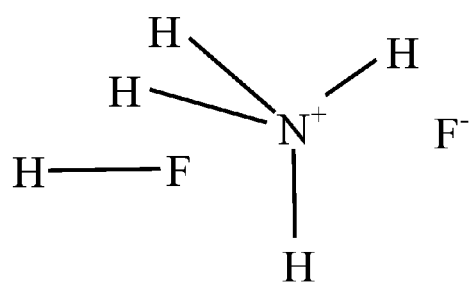
FIG. 6 shows the ammonium bifluoride, $NH_4HF_2$ (CAS No. 1341-49-7), product resulting from thermal decomposition.

$2(NH_4)_2SiF_6(s) \rightarrow 2SiF_4(g)\uparrow + 2NH_3(g)\uparrow + 2NH_4HF_2(s)$ FIG. 6 shows the ammonium bifluoride, $NH_4HF_2$(CAS No. 1341-49-7), product resulting from this thermal decomposition. Ammonium bifluoride is also known as: acid ammonium fluoride, ammonium acid fluoride, ammoniumbifluoride, ammonium difluoride, ammonium fluoride, ammonium hydrofluoride, ammonium hydrogen bifluoride, ammonium hydrogen difluoride, ammonium hydrogen fluoride, ammonium monohydrogen difluoride, and flammon crystals.

It is also known from the Material Safety Data Sheet of ammonium bifluoride, $NH_4HF_2(S)$:

"MSDS of Ammonium Bifluoride", Ampex Chemicals, S. A. de C. V., http://www.analytyka.com.mx/tabla%20periodica/MSDS/N/AMMONIUM% 20BIFLUORIDE.htm;

that the formed ammonium bifluoride, $NH_4HF_2(s)$, surface has a melting point of 124.6° C. and a boiling point of 240° C. at atmospheric pressure.

Figure 7A:
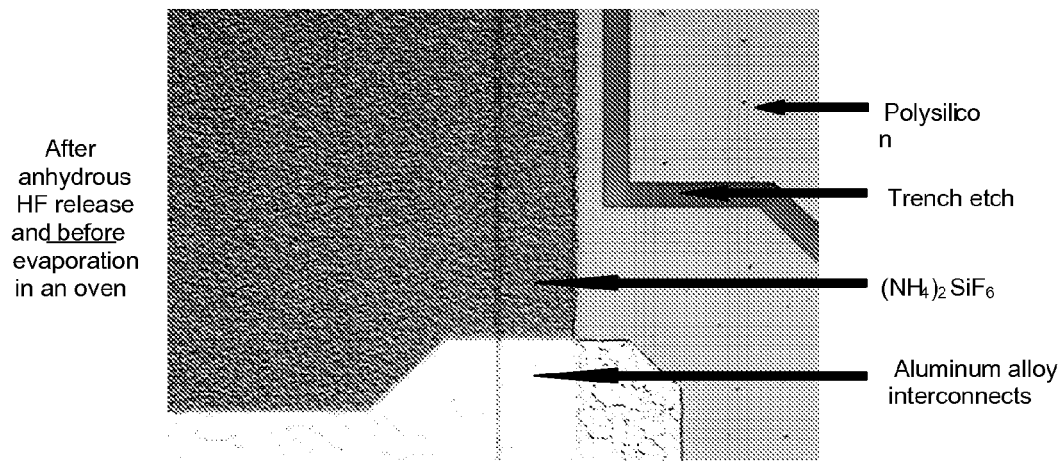
FIGS. 7a and 7b are top view optical pictures of a MEMS device released by removing the sacrificial oxide using the anhydrous HF release process.
Figure 7B:
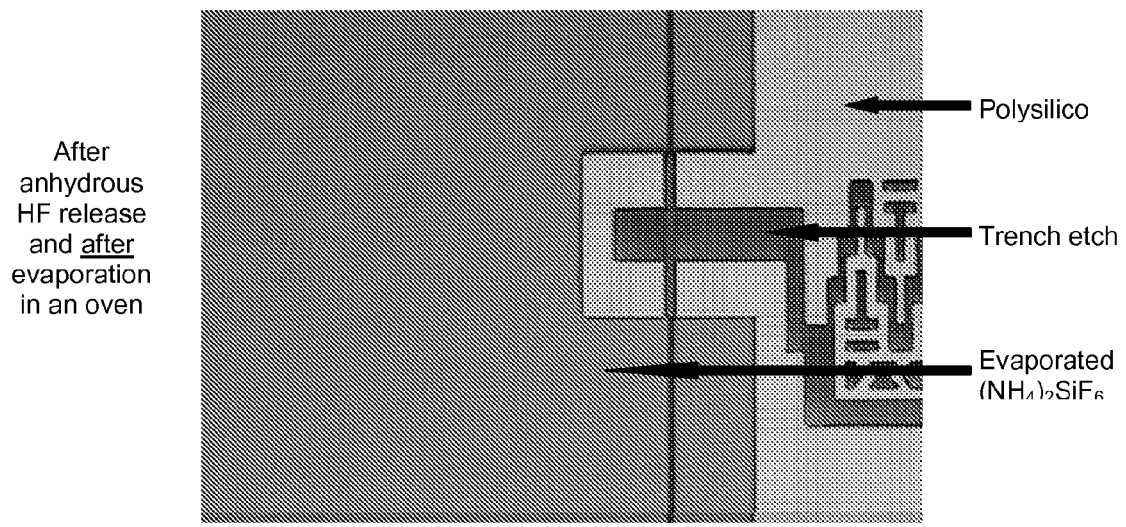

FIGS. 7a and 7b are top view optical pictures of a MEMS device released by removing the sacrificial oxide using the anhydrous HF release process. The top picture, FIG. 7a, shows a region located over the etch-stop silicon nitride following exposure to the anhydrous HF release process while the bottom picture shows a region of the same device also located over the etch-stop silicon nitride also following an exposure to the anhydrous HF release process but following an evaporation for a few minutes of the produced ammonium fluorosilicate under nitrogen ambient at a temperature of more than 240° C. at atmospheric pressure. These optical photographs clearly show how efficient is the evaporation.

Figure 8:
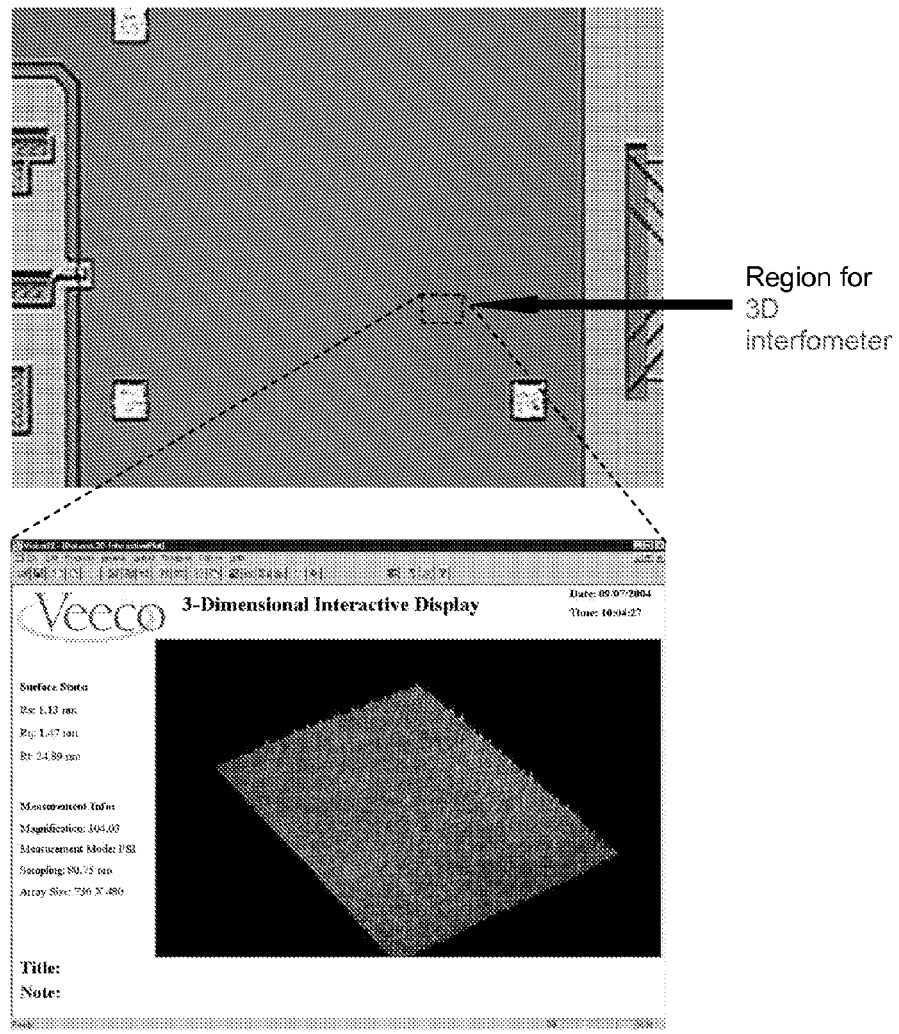
FIG. 8 shows a top view optical picture of the region of the silicon nitride of a MEMS device which had its mechanical structure released by removing the sacrificial oxide using the anhydrous HF release process.

FIG. 8 shows a top view optical picture of the region of the silicon nitride of a MEMS device which had its mechanical structure released by removing the sacrificial oxide using the anhydrous HF release process and which had the ammonium fluorosilicate evaporated under nitrogen ambient at a temperature of more than 240° C. at atmospheric pressure. The top view optical picture points the region of silicon nitride that has been attacked by the anhydrous HF release process and that has been cleared from its ammonium fluorosilicate following the evaporation under nitrogen ambient at a temperature of more than 240° C. at atmospheric pressure. The residual surface roughness of this same region is analyzed using white light 3D interferometry nanoimaging as to provide information about the residual topography following the evaporation of the ammonium fluorosilicate, $(NH_4)_2SiF_6$. The white light 3D interferometry nanoimaging clearly shows a very impressive smooth surface with a residual RMS (Rq) surface roughness of only 1.47 nm or about 7 atomic layers.

Figure 15:
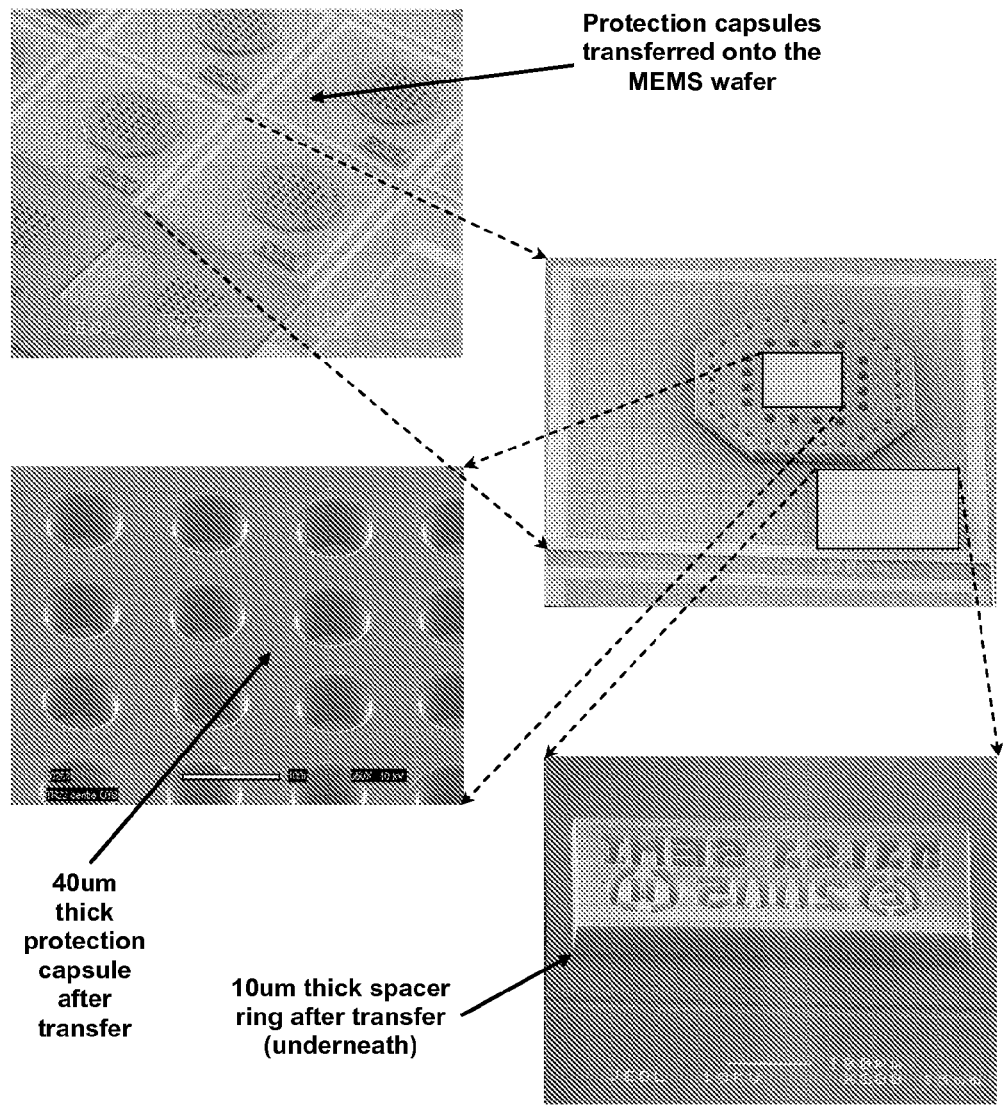
FIG. 15 is a top view of one of the thousands of millimeter size free-standing protection capsules transferred from the carrier wafer onto one of the thousands of complex and very sensitive free-to-move mechanical devices of the MEMS wafer.

The following publication:

B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620) gives an estimated phase diagram for ammonium bifluoride, $NH_4HF_2$. FIG. 15 shows a re-sketch of the proposed ammonium bifluoride, $NH_4HF_2$, phase diagram with an emphasis on the location of the triple point, i.e. the pressure and temperature at which the solid, liquid and gas phases of ammonium bifluoride, $NH_4HF_2$ coexist. This estimated location of the triple point predicts which conditions of vacuum and pressure should be used to allow the sublimation of ammonium bifluoride, without any intermediate liquid phase formation.

Figure 9:
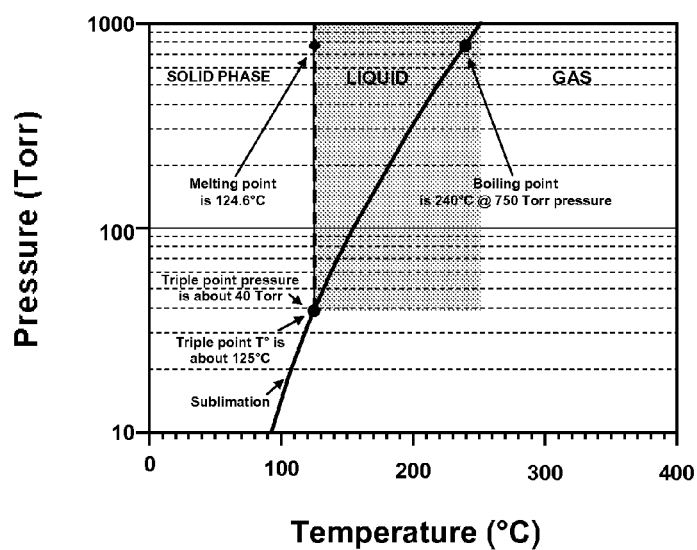
FIG. 9 is an Re-sketch of the ammonium bifluoride, NH4HF2(s), phase diagram from data proposed by B. Du Bois (IMEC, 1999)

It can be shown from FIG. 9 that the complete sublimation of ammonium fluorosilicate, $(NH_4)_2SiF_6(g)\uparrow$, and ammonium bifluoride, $NH_4HF_2(g)\uparrow$, is possible without liquid phase formation at a pressure of less than the ammonium bifluoride triple point pressure of about 40 Torr if the temperature is higher than the ammonium bifluoride sublimation temperature and if the temperature is higher than the ammonium fluorosilicate sublimation temperature:

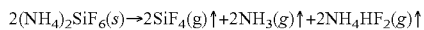

$2(NH_4)_2SiF_6(s) \rightarrow 2SiF_4(g)\uparrow + 2NH_3(g)\uparrow + 2NH_4HF_2(g)\uparrow$ FIG. 9 shows that an anhydrous HF release process operating at a pressure of less than the ammonium bifluoride triple point pressure of about 40 Torr and at the temperature of the highlighted grey zone of FIG. 15 could result in a complete sublimation of ammonium fluorosilicate and ammonium bifluoride resulting from the exposure of silicon nitride to anhydrous HF.

Figure 10:
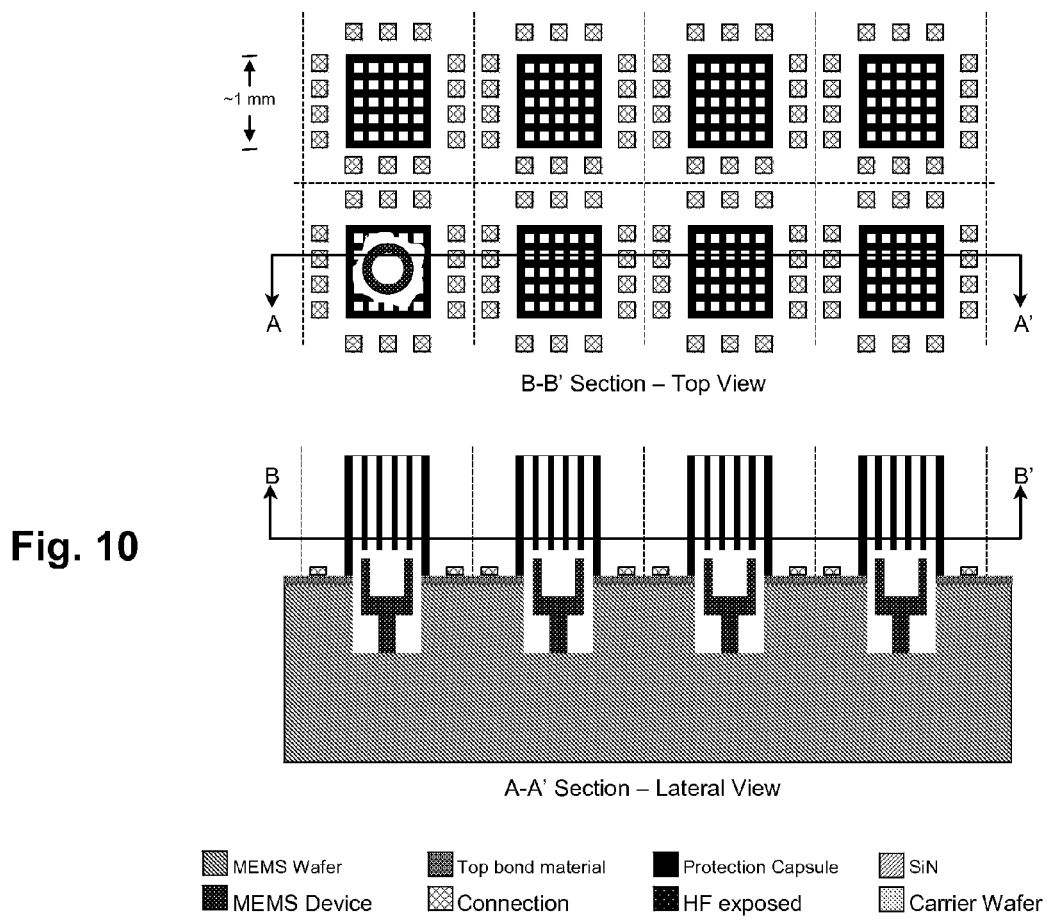
FIG. 10 is a schematic representation of a completed MEMS wafer integrating thousands of millimeter size free-standing protection capsules over thousands of complex and very sensitive free-to-move mechanical devices also integrating digital and/or analog CMOS control logic and/or high voltage CMOS drivers.

FIG. 10 is a schematic representation of a completed MEMS wafer integrating thousands of millimeter size free-standing protection capsules over thousands of complex and very sensitive free-to-move mechanical devices integrating digital and/or analog CMOS control logic and/or high voltage CMOS drivers capable of performing sensing and/or actuation functions for consumer electronics, automotive and other high volume and low cost MEMS applications.

The Section B-B' of this Figure shows that each individual polymer-based protection capsule is protecting its individual free-to-move mechanical device (one of the capsule is shown broken as to open the view to the underlying complex and very sensitive free-to-move mechanical device) while the openings between the individual protection capsules allow the contacts to the exposed bond pads as to connect the integrated digital and/or analog CMOS control logic and/or high voltage CMOS drivers capable of performing the sensing and/or actuation functions. The Section B-B' of this FIG. 16 also shows as dotted lines the planned dicing lanes used to singularize the individual protected MEMS devices.

The Section A-A' of this FIG. 10 shows that each individual polymer-based free-standing protection capsule provides a large enough head space above its underlying complex and very sensitive free-to-move mechanical device as to allow its proper operation. It also shows that this polymer-based protection capsule provides can be thick enough to allow large diameter protection capsules to be used without concerns with buckling and collapsing of the protection capsules during fabrication or operation. The Section A-A' of this FIG. 16 also shows as dotted lines the planned dicing lanes used to singularize the individual protected MEMS devices.

Figure 11:
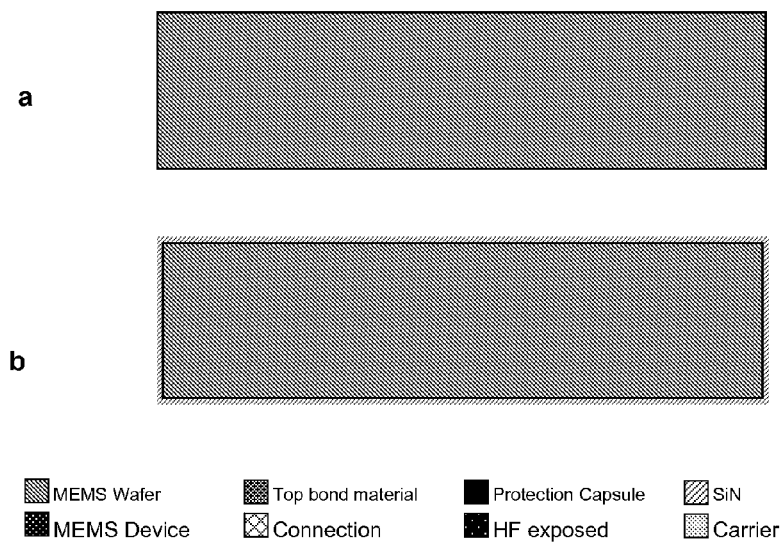
FIG. 11 shows in schematic form the sequence of steps for the complete membrane transfer process flow using this new temporary adhesion layer made of a silicon nitride layer exposed to anhydrous hydrofluoric acid.
Figure 11:
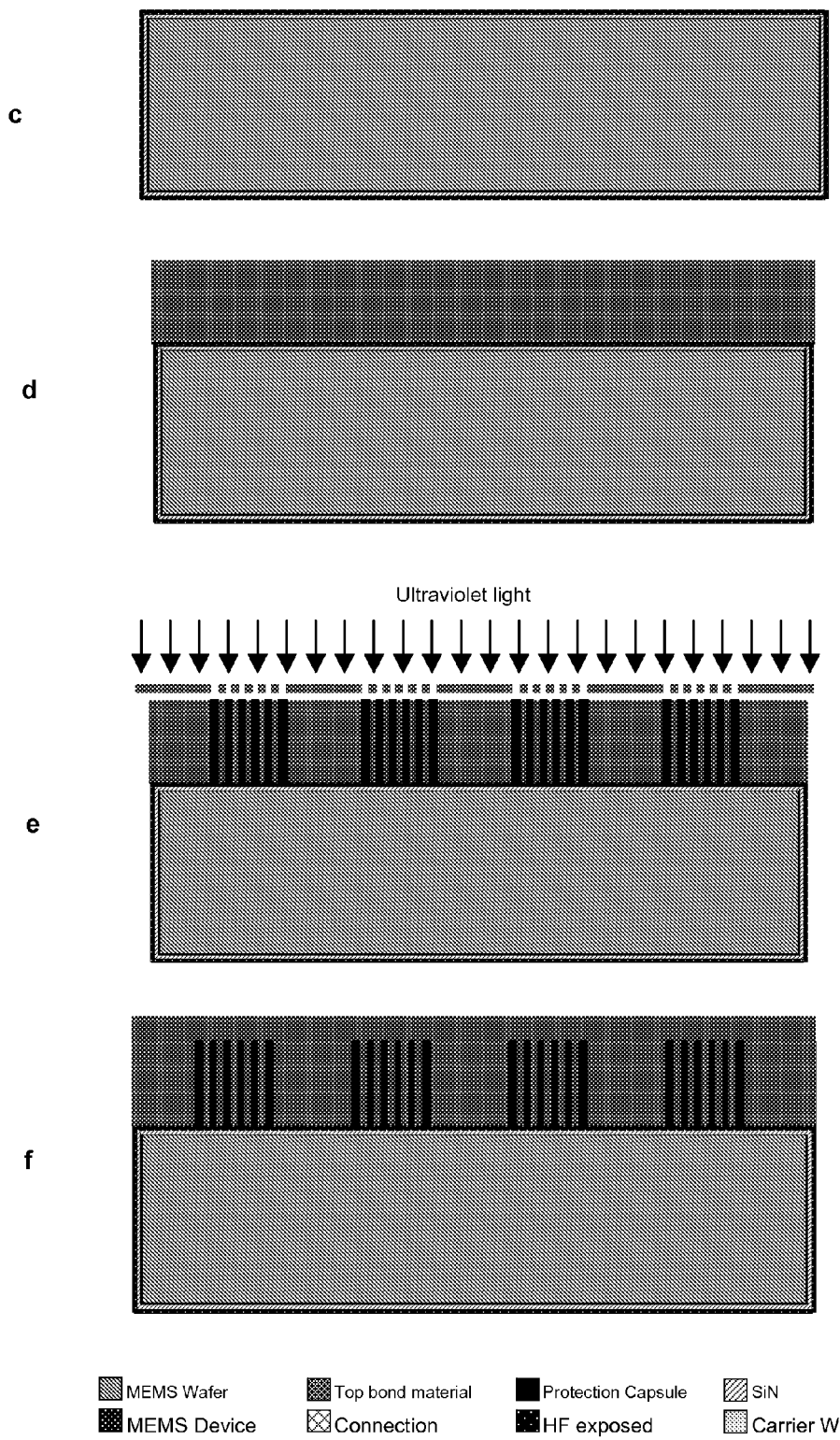
Figure 11:
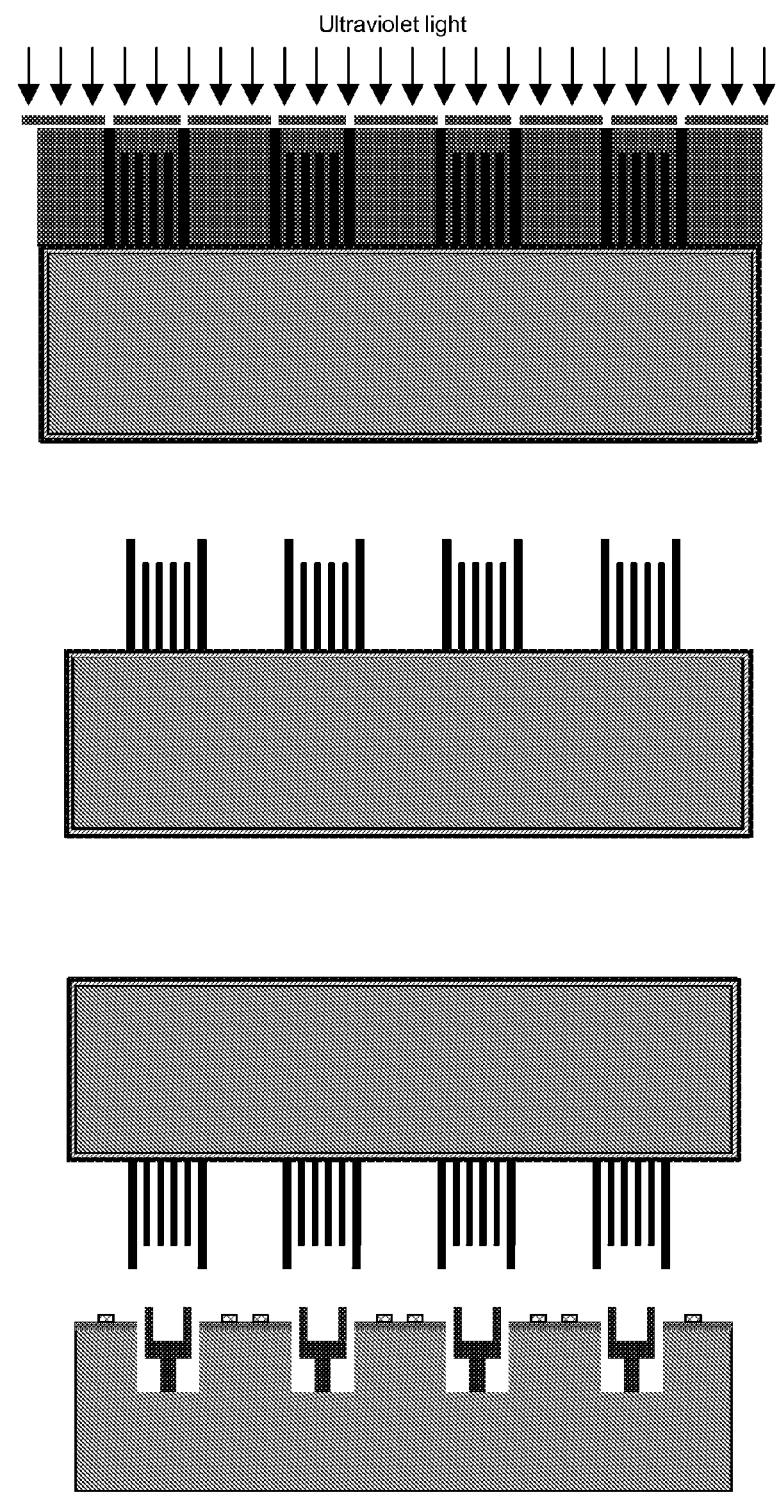
Figure 11:
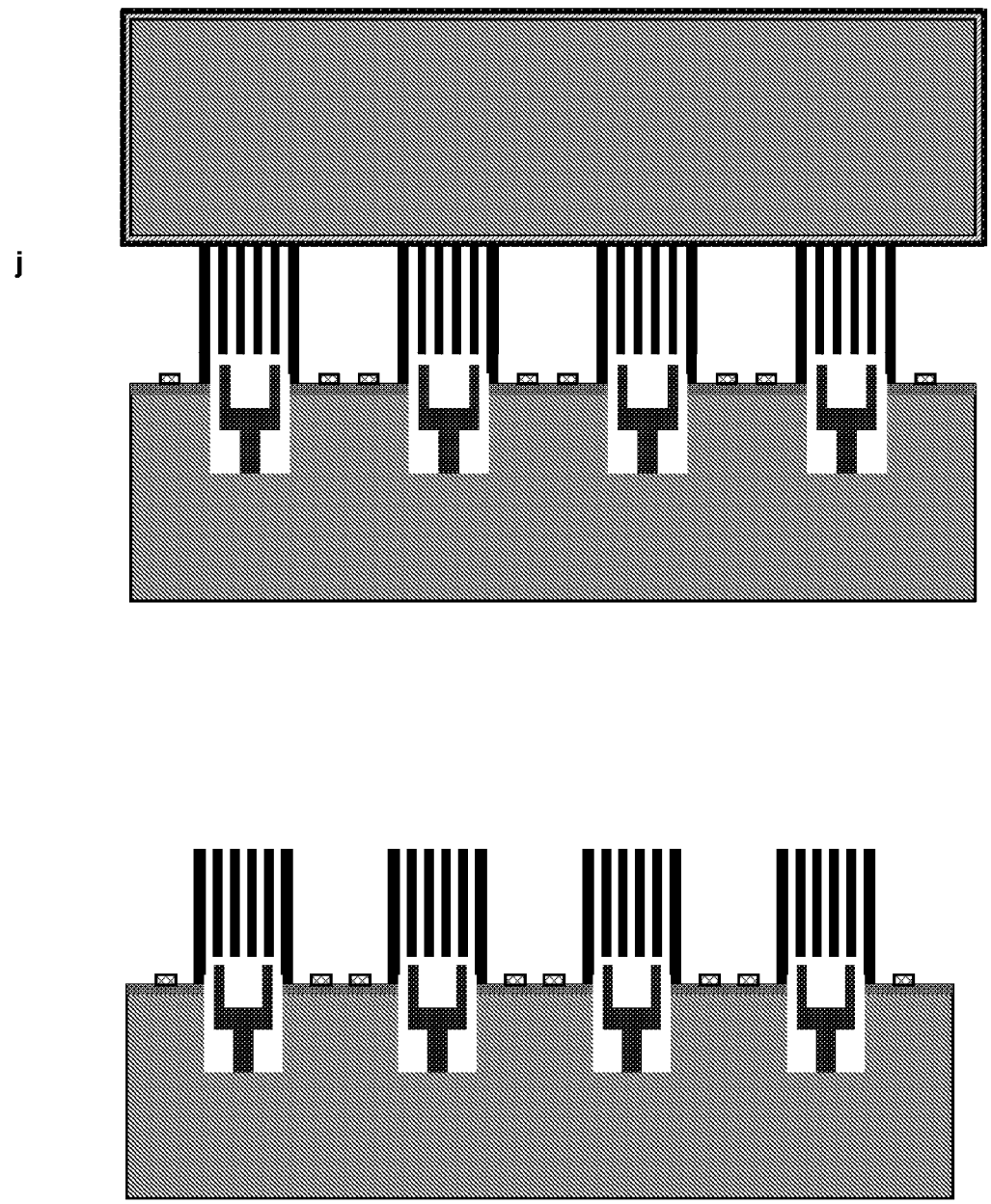

FIG. 11 shows in schematic form the sequence of steps for the complete membrane transfer process flow using this new temporary adhesion layer made of a silicon nitride layer exposed to anhydrous hydrofluoric acid.

In step a, a silicon wafer is used as carrier wafer of the protection capsules to be transferred to the MEMS wafer. This silicon wafer is preferably a SEMI standard 150 mm diameter silicon wafer but could also be a 100 mm diameter, a 200 mm diameter or a 300 mm diameter silicon wafer.

In step b, a layer is silicon nitride is deposited onto the silicon carrier wafer prior to exposure to anhydrous HF. This silicon nitride layer is preferably deposited using a Bruce/Kokusai Low Pressure Chemical Vapour Deposition, LPCVD, horizontal furnace at a preferable temperature of about 830° C. preferably using a mixture of dichlorisilane, $SiH_2Cl_2$ and ammonia, $NH_3$, as to preferably produce a 0.3 µm thick layer of silicon nitride. This silicon layer could also be deposited at other temperatures ranging from 750° C. to 900° C. and at other thicknesses ranging from 0.05 um to 1.0 um. This silicon layer could also be deposited using LPCVD in a vertical LPCVD furnace. This silicon layer could also be deposited at a much lower temperature ranging from 200° C. to 500° C. with a Plasma Enhanced Chemical Vapour Deposition, PECVD, equipment using mixtures of silane, $SiH_4$ and ammonia, $NH_3$. In that case, the silicon nitride would be a hydrogenated PECVD silicon nitride layer.

In step c, chemical conversion of the external surface of silicon nitride into ammonium fluorosilicate is peformed following its exposure to anhydrous HF. The thickness of silicon nitride and the anhydrous HF exposure are such that only a portion of the total thickness of silicon nitride is converted to ammonium fluorosilicate, thus leaving a residual underlayer of silicon nitride. In one example, a 0.1 um thick silicon nitride is converted into ammonium fluorosilicate, $(NH_4)_2SiF_6$, following its exposure to anhydrous hydrofluoric acid, HF, under a controlled sub-atmospheric pressure of anhydrous HF. The preferably 0.3 µm thick initial layer of silicon nitride and the preferable anhydrous HF exposure are such that only the external 0.1 µm of the preferably 0.3 µm thick silicon nitride is converted to ammonium fluorosilicate by releasing volatile silicon tetrafluoride, $SiF_4$, while leaving a residual underlayer of silicon nitride;

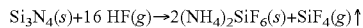

$$Si_3N_4(s) + 16\ HF(g) \rightarrow 2(NH_4)_2SiF_6(s) + SiF_4(g)\uparrow$$

This controlled sub-atmosperic conversion process using anhydrous HF is performed at preferably 70 Torr of anhydrous HF in a Primaxx specialized anhydrous HF processor such as the one shown in FIG. 31. Following this surface conversion, the anhydrous HF is stopped and the wafers are exposed to nitrogen ambient before being manipulated under atmospheric conditions to the next step of the process. This silicon nitride layer could also be converted in another type of equipment than the one shown in FIG. 31. This silicon nitride layer could also be converted at a pressure ranging between 10 and 750 Torr. This silicon nitride layer could also be converted in gas mixtures involving anhydrous HF and an organic volatile, such as: methanol, acetone, 1-buthanol, 2-buthanol, 1-propanol or 2-propanol. Finally, this silicon nitride layer could also be converted in gas mixtures involving anhydrous HF, nitrogen and solvents or alcohols such as methanol, acetone, 1-buthanol, 2-buthanol, 1-propanol or 2-propanol.

In step d, a first layer of a thick negative tone photopolymer is applied by spinning onto the exposed layer of ammonium fluorosilicate. The thickness of this first layer is adjusted in such a way that it will be strong enough to become a protection capsule. Following proper dispense, spinning and solidification by partial solvents evaporation, the dried photopolymer is subjected to a pre-exposure bake not exceeding 95° C. as to drive-off more of its residual solvents in preparation for the exposure to ultra-violet light through a properly designed mask. A preferred photopolymer is SU-8, a negative tone epoxy-like near-UV photoresist originally developed, and patented by IBM:

U.S. Pat. No. 4,882,245 titled: 'Photoresist Composition and Printed Circuit Boards and Packages Made Therewith'

This high performance photopolymer is available from three companies:

MicroChem Corporation, a company previously named Microlithography Chemical Corporation, of Newton, Mass., USA. The photopolymer is sold under the name NANO SU-8 at different viscosities: SU-8 2005; SU-8 2010; SU-8 2025; SU-8 2050; SU-8 2100;

Gerstel Ltd, a company previously named SOTEC Microsystems, of Pully, Switzerland. The photopolymer is sold under the name GM or GLM at different viscosities: GM1040; GM1060; GM1070, GLM2060, GLM3060.

Kayaku Microchem Corporation (KMCC), of Chiyoda-Ku, Tokyo, Japan. The photopolymer is sold under the name XP KMPR-1000 SU8 at different viscosities: XP KMPR-1005; XP KMPR-1010; XP KMPR-1025; XP KMPR-1050; XP KMPR-1100;

This high performance photopolymer is spin coated using one of the two coat stations of an EV Group Hercules processor. About 3 ml of Microchem SU-8 2025 photopolymer solution is dispensed above the 150 mm wafer before spinning at about 1600 RPM as to dry the spin-on photopolymer by partial solvents evaporation and as to achieve a film thickness of preferably 40 µm to be strong enough to become the protection capsule. The dried photopolymer is subjected to a pre-exposure bake not exceeding 95° C. and for about 8 to 10 minutes as to drive-off more of its residual solvents. This MicroChem SU-8 2025 negative tone photopolymer can alternately be replaced by the Gerstel GM 1060 or GLM2060 negative tone photopolymer or by the Kayaku Microchem XP KMPR 1025 negative tone photopolymer to achieve the same preferred thickness of 40 um. The viscosity of the photopolymer solution could be lower then the one of the Microchem SU-8 2025 photopolymer solution as to reduce the thickness of this first layer of negative tone photopolymer from 40 um down to about 5 µm. In that case, the Microchem SU-8 2005 or SU-8 2010 negative tone photopolymer solution could be used, the Gerstel GM 1040 negative tone photopolymer solution could be used, or the Kayaku Microchem XP KMPR 1005 or XP KMPR-1010 negative tone photopolymer solution could be used. Alternately, the viscosity of the photopolymer solution could be higher then the one of the Microchem SU-8 2025 photopolymer solution as to increase the thickness of this first layer of negative tone photopolymer from 40 µm down to about 500 µm. In that case, the Microchem SU-8 2050 or SU-8 2100 negative tone photopolymer solution could be used, the Gerstel GM 1070 negative tone photopolymer solution could be used, or the Kayaku Microchem XP KMPR 1050 or XP KMPR-1100 negative tone photopolymer solution could be used. To thicker negative tone photopolymer layers should be associated a longer than 90 seconds pre-exposure bake but still not exceeding 95° C. and for about as to drive-off the residual solvents.

In step e, this first layer of a thick negative tone photopolymer is exposed to ultraviolet light through the openings of the mask defining the shape of the protection capsule. Following ultraviolet light exposure for an optimized dose, this first layer of a thick negative tone photopolymer is subjected to a post-exposure bake again not exceeding 95° C. as to drive-off more of the residual solvents and the chemical by-products formed by the ultra-violet light exposure. At this point, the exposed photopolymer is not yet developed.

In one example, this first layer of a preferably 40 um thick negative tone photopolymer is exposed using the highly collimated broadband UV source (g-line, h-line and l-line) of the EV Group Hercules processor through the openings of the mask defining the shape of the protection capsule. Being of negative tone, the photopolymer will reticulate in the regions exposed to the ultraviolet light and will locally become resistant to the chemical attack of the developer to be used later in the process. Following ultraviolet light exposure for an optimized dose of about 310 mJ/cm², this first layer of a thick negative tone photopolymer is subjected to a 5 minutes duration post-exposure bake again not exceeding 95° C. as to drive-off more of the residual solvents and the chemical by-products formed by the ultra-violet light exposure. At this point, the exposed photopolymer is not yet developed. Again, if this MicroChem SU-8 2025, Gerstel GM 1060 or GLM2060 or Kayaku Microchem XP KMPR 1025 negative tone photopolymer is replaced by a lower viscosity solution such as the Microchem SU-8 2005 or SU-8 2010, the Gerstel GM 1040 or the Kayaku Microchem XP KMPR 1005 or XP KMPR-1010 negative tone photopolymer solution, then the optimized dose would be lower than about 310 mJ/cm², as to prevent over-exposure of this first layer of a negative tone photopolymer. Alternatively, if this MicroChem SU-8 2025, Gerstel GM 1060 or GM 2060 or Kayaku Microchem XP KMPR 1025 negative tone photopolymer is replaced by a higher viscosity solution such as the Microchem SU-8 2050 or SU-8 2100, the Gerstel GM 1070 or the Kayaku Microchem XP KMPR 1050 or XP KMPR-1100 negative tone photopolymer solution, then the optimized dose would be higher than about 310 mJ/cm², as to prevent under-exposure of this first layer of a negative tone photopolymer. To thicker negative tone photopolymer layers should also be associated a longer than 90 seconds post-exposure bake but still not exceeding 95° C.

In step f, a second layer of a thick negative tone photopolymer is applied by spinning onto the exposed first layer of a thick negative tone photopolymer. The thickness of this second layer is adjusted in such a way that it will form tall enough spacer rings as to provide enough head space between the upper surface of the free-to-move mechanical devices and the bottom surface of the protection capsule. Again, following proper dispense, spinning and solidification by partial solvents evaporation, the dried photopolymer is subjected to a pre-exposure bake not exceeding 95° C. as to drive-off more of its residual solvents in preparation for the exposure to ultra-violet light through a properly designed mask.

In one example, the second layer is preferably a 10 μm thick negative tone photopolymer that is applied by spinning onto the exposed first layer of a preferably 40 μm thick negative tone photopolymer. Again, this high performance photopolymer is spin coated using one of the two coat stations of the EV Group Hercules processor. Again, about 3 ml of Microchem SU-8 2005 is dispensed above the 150 mm wafer before spinning at about 1600 RPM as to dry the spin-on photopolymer by partial solvents evaporation and as to achieve a film thickness of preferably 10 um to be tall enough to provide enough head space between the upper surface of the free-to-move mechanical devices and the bottom surface of the protection capsule.

The dried photopolymer is subjected to a pre-exposure bake not exceeding 95° C. and for about 5 minutes as to drive-off more of its residual solvents. This MicroChem SU-8 2005 negative tone photopolymer can alternately be replaced by the MicroChem SU-8 2010, the Gerstel GM 1040 or the Kayaku Microchem XP KMPR 1005 or XP KMPR 1010 negative tone photopolymer to achieve the same preferred thickness of 10 um. The viscosity of the photopolymer solution could be higher than the one of the MicroChem SU-8 2005 photopolymer solution as to increase even more the head space between the upper surface of the free-to-move mechanical devices and the bottom surface of the protection capsule from about 10 μm up to about 500 μm. In that case, the Microchem SU-8 2025 or SU-8 2050 or SU-8 2100, the Gerstel GM 1060, GM 1070 or GM 2060 or the Kayaku Microchem XP KMPR 1025, XP KMPR 1050 or XP KMPR-1100 negative tone photopolymer solution could be used. Again, to thicker negative tone photopolymer layers should be associated a longer than 90 seconds pre-exposure bake but still not exceeding 95° C. and for about as to drive-off more of its residual solvents in preparation for the exposure to ultra-violet light through a properly designed mask.

In step g, this second layer of a thick negative tone photopolymer is exposed to ultraviolet light through the openings of the mask (aligned to the previously exposed first layer) defining the shape of the spacer rings fixing the head space between the upper surface of the free-to-move mechanical devices and the bottom surface of the protection capsule. Following ultraviolet light exposure for an optimized dose, this second layer of a thick negative tone photopolymer is subjected to a post-exposure bake again not exceeding 95° C. as to drive-off more solvents and chemical by-products formed by the ultra-violet light exposure.

In one example, the second layer is preferably a 10 μm thick MicroChem SU-8 2005 negative tone photopolymer aligned to the first layer and exposed using the highly collimated broadband UV source (g-line, h-line and I-line) of the EV Group Hercules through the openings of the mask (aligned to the previously exposed first layer) defining the shape of the spacer rings fixing the head space between the upper surface of the free-to-move mechanical devices and the bottom surface of the protection capsule. Being of negative tone, the photopolymer will reticulate in the regions exposed to the ultraviolet light and will locally become resistant to the chemical attack of the developer to be used later in the process. Following ultraviolet light exposure for an optimized dose of about 180 mJ/cm², this first layer of a thick negative tone photopolymer is subjected to a 3 minutes duration post-exposure bake again not exceeding 95° C. as to drive-off more of the residual solvents and the chemical by-products formed by the ultra-violet light exposure. Again, if this MicroChem SU-8 2005 or SU-8 2010, this Gerstel GM 1040 or this Kayaku Microchem XP KMPR 1005 or XP KMPR 1010 negative tone photopolymer is replaced by a higher viscosity solution such as the Microchem SU-8 2025 or SU-8 2050 or SU-8 2100, the Gerstel GM 1060, GM 1070 or GM 2060 or the Kayaku Microchem XP KMPR 1025, XP KMPR 1050 or XP KMPR-1100 negative tone photopolymer solution, then the optimized dose would be higher than about 180 mJ/cm², as to prevent under-exposure of this second layer of a negative tone photopolymer. To thicker negative tone photopolymer layers should also be associated a longer than 90 seconds post-exposure bake but still not exceeding 95° C.

In step h, the first and the second layers of thick negative tone photopolymers are developed together, thus defining the shape of the protection capsule and the shape of the spacer ring fixing the head space between the upper surface of the free-to-move mechanical devices and the bottom surface of the protection capsule. The regions of the photopolymer that have being exposed to the ultraviolet light passing through the openings of one or both of the masks remain intact because resistant to the chemical attack of the developer. Following suitable development of the photopolymer, the resulting photopolymer patterns are subjected to a post-develop bake again not exceeding 95° C. as to drive-off more of the residual solvents and the chemical by-products formed by the ultra-violet light exposure and by the develop. At this point, the developed and baked photopolymer patterns are ready to be aligned to the MEMS wafer, in preparation for temporary bonding of the carrier wafer to the MEMS wafer.

In one example, the first layer is preferably a 40 µm thick MicroChem SU-8 2025 negative tone photopolymer and the second layer preferably a 10 µm thick MicroChem SU-8 2005 negative tone photopolymer are developed together using one of the two develop stations of the EV Group Hercules processor so as to define the shape of the protection capsule and the shape of the spacer ring fixing the head space between the upper surface of the free-to-move mechanical devices and the bottom surface of the protection capsule. The regions of the photopolymer that have being exposed to the ultraviolet light passing through the openings of one or both of the masks remain intact because resistant to the chemical attack of the developer. These two layers of negative tone photopolymers are capable of achieving complex structures and mechanical features having a height:width aspect ratio as high as 10:1. An example of such a combination of a preferably 40 µm thick first patterned layer of negative tone photopolymer (defining the protection capsule) under a preferably 10 µm thick second patterned layer of negative tone photopolymer (defining the spacer ring fixing the head space between the upper surface of the free-to-move mechanical devices and the bottom surface of the protection capsule) in the various SEM pictures of FIG. 14. At this point, the developed and baked photopolymer patterns are ready to be aligned to the MEMS wafer, in preparation for temporary bonding of the carrier wafer to the MEMS wafer. As will be seen in this figure, the protection capsule comprises an outer sealing ring, which is sealed to the receiving substrate, and cap surface 14 with holes 16 that give the internal moving components for the MEMS device access to the ambient atmosphere.

In step I, the carrier wafer supporting the developed and baked photopolymer patterns is flipped-over and properly aligned to the MEMS wafer integrating the complex and very sensitive free-to-move mechanical devices, the digital and/or analog CMOS control logic and/or high voltage CMOS drivers. The precise alignment is such that the thousands of spacer rings defining the head space between the upper surface of the thousands of free-to-move mechanical devices and the bottom surface of the thousands of protection capsules will not make any direct contact to the thousands of free-to-move mechanical devices upon physical contact of the two wafers. The aligned wafers, not yet in physical contact, are kept in position using a special fixture in preparation for loading of the pair of wafers into a vacuum-based wafer bonding equipment.

The carrier wafer may be flipped-over and properly aligned to the MEMS wafer integrating the complex and very sensitive free-to-move mechanical devices using the SmartView aligner of the EV Group Gemini processor. The precise alignment, of the order of 1 µm, is such that the thousands of spacer rings defining the head space between the upper surface of the thousands of free-to-move mechanical devices and the bottom surface of the thousands of protection capsules will not make any direct contact to the thousands of free-to-move mechanical devices upon physical contact of the two wafers. The aligned wafers, not yet in physical contact, are kept in position using a special fixture in preparation for loading of the pair of wafers into one of the four Universal bond chamber of the EV Group Gemini processor.

In step j, the pair of properly aligned wafers are loaded into the wafer bonding equipment that allows these to become in physical contact by pressing one against the other (without losing alignment accuracy). The pair of wafers is then heated to a temperature not exceeding 95° C. while maintaining the two wafers under intimate contact, as to provoke the bonding of the photopolymer of the carrier wafer to the exposed top bond material of the MEMS wafer. Again, the precise alignment of the two wafers is such that the thousands of protection capsules do not make any direct contact to the thousands of free-to-move mechanical devices during this bonding process. Following proper baking at a temperature not exceeding 95° C. while maintaining the two wafers under intimate contact, the pair of wafers is unloaded from the wafer bonding equipment.

In one example, the pair of properly aligned wafers are loaded into one of the four Universal bond chamber of the EV Group Gemini processor. This Universal bond chamber allows the carrier wafer and the MEMS wafer to become in physical contact by slowly pressing one against the other (without losing alignment accuracy) with a uniform force of 5 kN to 20 kN while heating the two wafers at a temperature not exceeding 95° C. for about 20 minutes as to provoke the permanent bonding of the photopolymer of the carrier wafer to the exposed top bond material of the MEMS wafer. Again, the precise alignment of about 1 um achieved with the SmartView is such that the thousands of protection capsules of the carrier wafer do not make a direct contact to the thousands of free-to-move mechanical devices of the MEMS wafer during this bonding process. The bonded pair of wafers is unloaded from the Universal bond chamber, cooled-down to room temperature using a cool station and returned in a properly designed receiving cassette.

In step k, the pair of bonded wafers is heated to a temperature exceeding 100° C. as to decompose the thermally unstable ammonium fluorosilicate, $(NH_4)_2SiF_6(s)$, of the carrier wafer which provokes the sudden formation and evaporation of volative silicon tetrafluoride, $SiF_4(g)\uparrow$, and volative ammonia, $NH_3(g)\uparrow$, and which results in the formation of a residual ammonium bifluoride, $NH_4HF_2(s)$, surface on the CARRIER wafer:

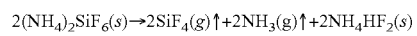

$$2(NH_4)_2SiF_6(s) \rightarrow 2SiF_4(g)\uparrow + 2NH_3(g)\uparrow + 2NH_4HF_2(s)$$

This sudden gas formation results in a mechanical release of the carrier wafer from the MEMS wafer that can now be separated at that temperature, leaving the thousands of protection capsules bonded via the thousands of spacer rings to the top bond material of the MEMS wafer without making a direct contact to the thousands of free-to-move mechanical devices.

The separated MEMS wafer now integrating the thousands of transferred protection capsules is exposed to a vacuum lower than 100 Pa at a temperature of 200° C. for four hours to polymerize the transferred protection capsules and to allow these to convert into a series of hard and very adherent epoxy-like protection capsules. At that stage, the MEMS wafer is covered with thousands of millimeter size free-standing epoxy-like protection capsules above thousands of complex and very sensitive free-to-move mechanical devices.

Figure 16:
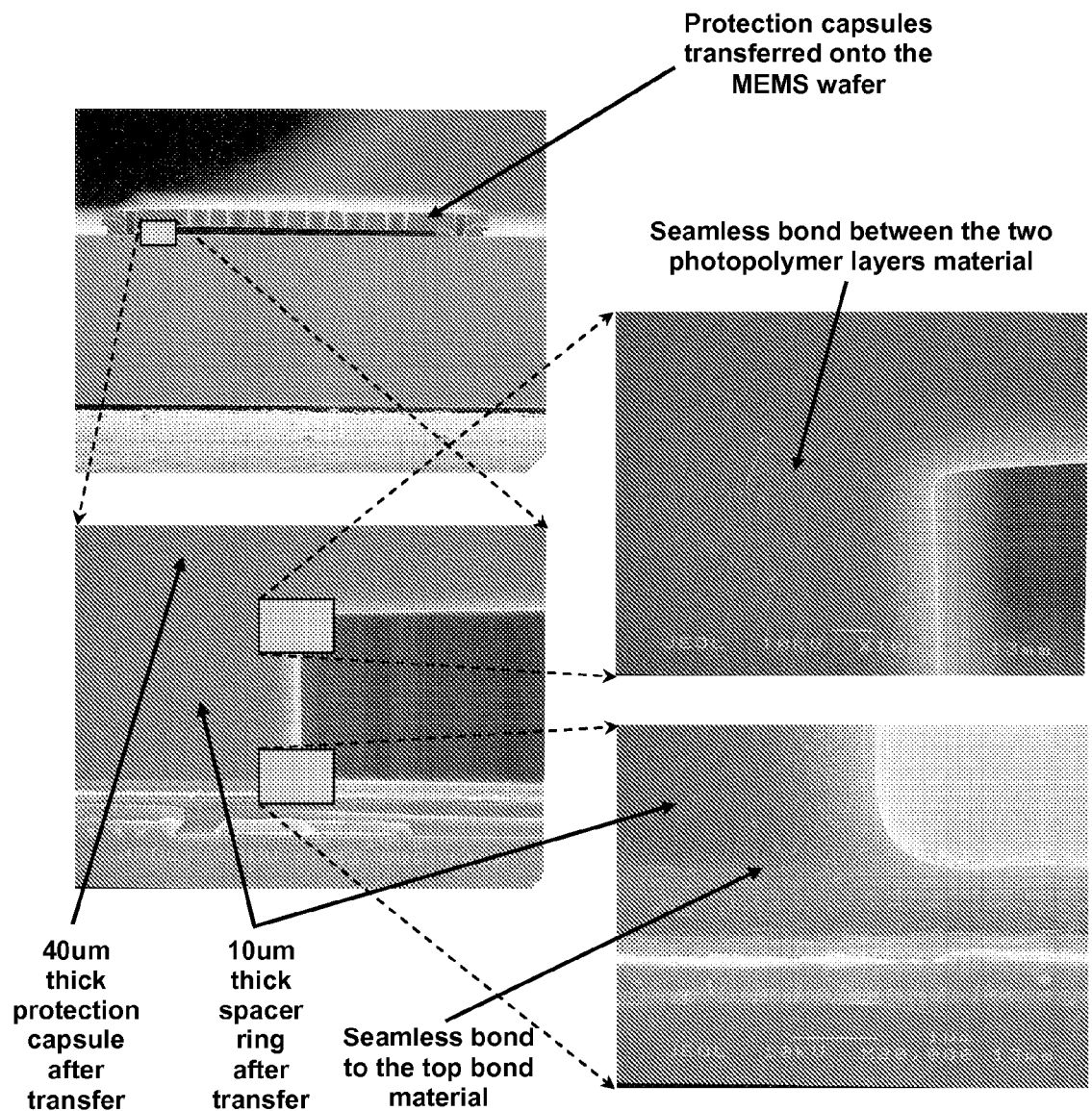
FIG. 16 is a cross-sectional view of one of the thousands of millimeter size free-standing protection capsules transferred from the carrier wafer onto one of the thousands of complex and very sensitive free-to-move mechanical devices of the MEMS wafer.

FIG. 15 is a series of top view SEM pictures of one of these thousands of millimeter size free-standing epoxy-like protection capsules transferred from the CARRIER wafer onto one of the thousands of complex and very sensitive free-to-move mechanical devices of the MEMS wafer. FIG. 16 shows a series of cross-section SEM pictures of one of these thousands of millimeter size free-standing epoxy-like protection capsules transferred from the CARRIER wafer onto one of the thousands of complex and very sensitive free-to-move mechanical devices of the MEMS wafer. The free-to-move mechanical device underneath the epoxy-like protection capsule is not shown on the pictures. FIG. 16 shows that the epoxy-like protection capsule is very well bonded to the top bonding material of the MEMS wafer. This top bonding material is preferably silicon oxide but can also be silicon, silicon nitride, aluminum or others common metals used in the manufacturing of CMOS or MEMS devices. The bonding between the transferred epoxy-like protection capsule and the top bonding material of the MEMS wafer is clearly of high quality since the interface is absolutely seamless.

Figure 12:
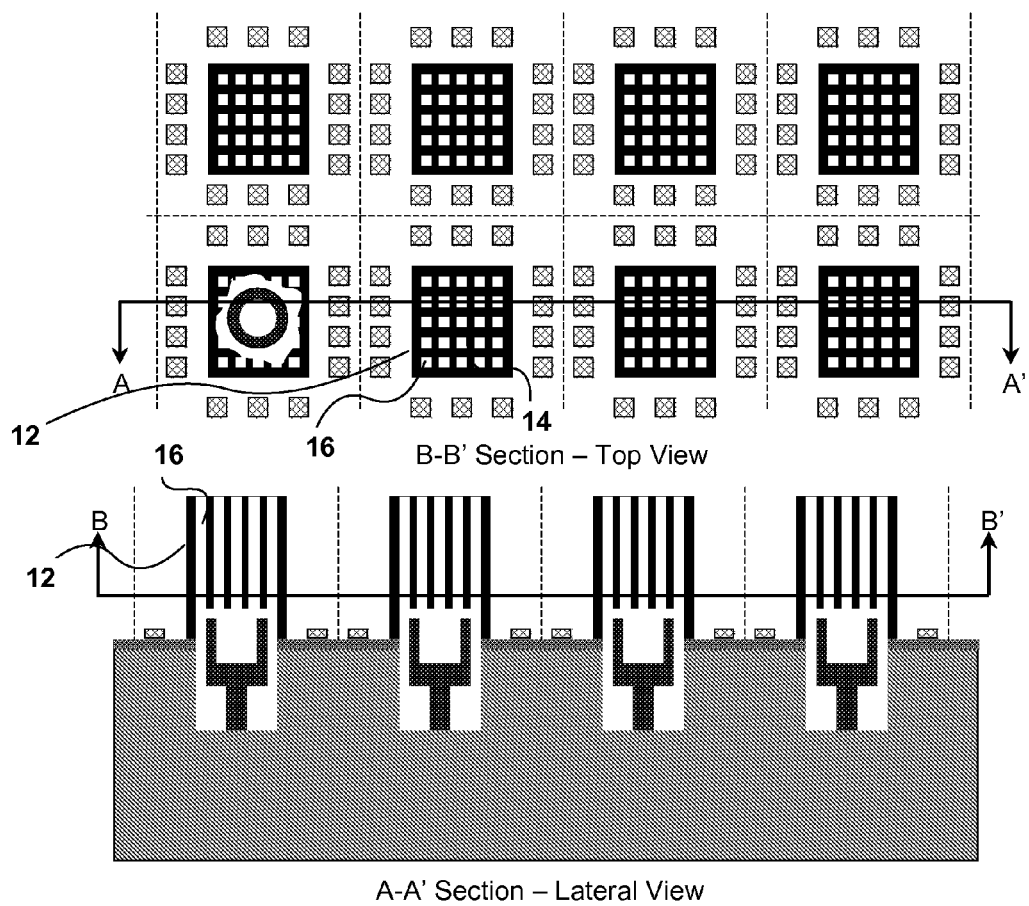
FIG. 12 shows the MEMS wafer mounted on frame and diced with a dicing saw to produce thousands of individual devices now free to be picked and placed.
Figure 13:
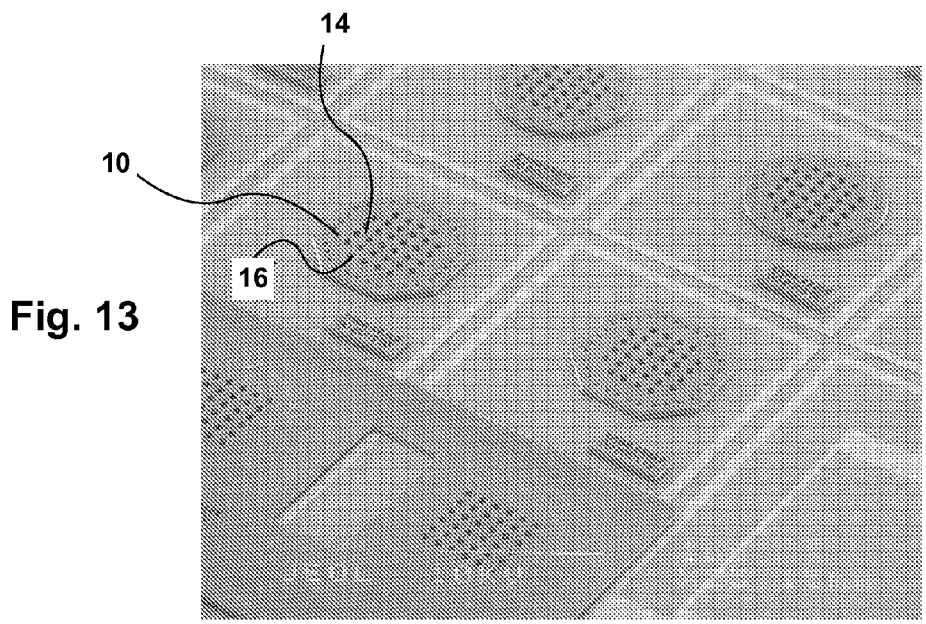
FIG. 13 shows a MEMS wafer containing thousands of individual devices, each protected by its individual protection capsule (three different types of capsules are shown here)
Figure 14:
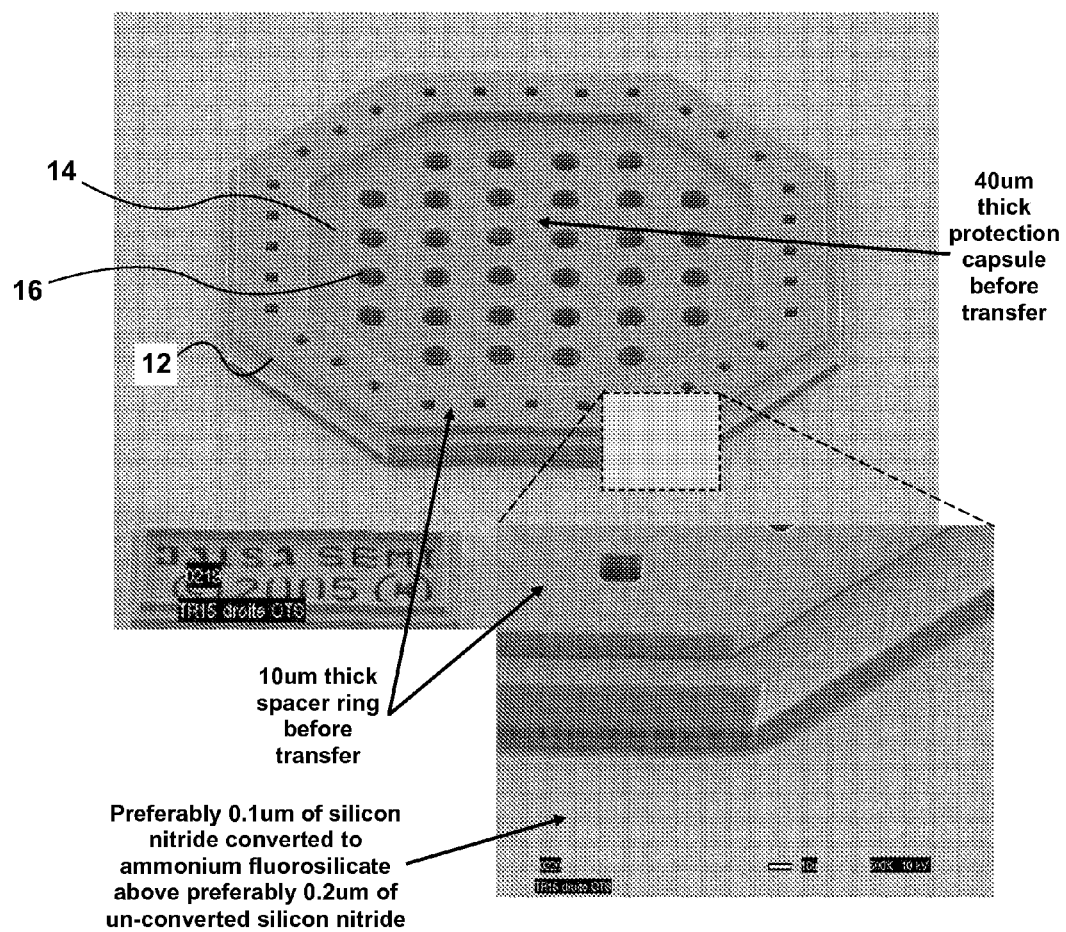
FIG. 14 shows a combination of a 40 μm thick photopolymer pattern (defining the protection capsule) under a 10 μm thick photopolymer pattern (defining the spacer ring fixing the head space between the upper surface of the free-to-move mechanical devices and the bottom surface of the protection capsule).

FIG. 12 shows that the MEMS wafer is mounted on frame and diced with a dicing saw to produce thousands of individual devices now free to be picked and placed. The protection capsule as illustrated in diagrammatic form in this figure and better seen in FIG. 14 copmrises a cap surface 14 defining an array of holes 16 and having an outer sealing ring 16. The illustration in FIGS. 11 and 12 is of course schematic. FIGS. 13 and 14 give a clearer picture of what the protection capsules look like in practice.

FIG. 13 shows a SEM picture of a MEMS wafer integrating thousands of millimeter size free-standing protection capsules. The following will now describe in detail this invention.

To evaluate the quality of the two seamless interfaces shown in FIG. 16, a Royce System 552 shear tester is used to quantify the lateral displacement when a gradually increasing shear force is applied. FIG. 17 shows the operation principle of this Royce System 552 shear tester when used to quantify the shear strength of the transferred protection capsule onto the MEMS wafer. The following references provide some information about tensile strength and shear strength values typically achieved for SU-8:

H. Noh, K. Moon, A. Cannon, P. J. Hesketh, C. P. Wong, "Wafer Bonding Using Microwave Heating of Parylene Intermediate Layers", Journal of Micromechanics and Microengineering, Vol. 14, 625-631, 2004

H. S. Khoo, K. Liu, F. Tseng, "Mechanical strength and interfacial failure analysis of cantilevered SU-8 microposts", J. Micromech. Microeng., Vol. 13, pp. 822-831, 2003

The first reference (Hoh and Al) reports a tensile strength of 20.8 MPa for SU-8 while the second reference (Khoo and Al) reports an interfacial shear fracture at 6.83 MPa for SU-8 on silicon.

FIG. 18 shows the shrear strength measurements for six different protection capsules transferred to the MEMS wafer using the present invention. It is clear that the measured shear strength values ranging from 30.1 MPa and 42.2 MPa demonstrate the bond quality of the two seamless interfaces of FIG. 16.

These excellent shear strength results are so impressive that they needed to be confirmed by another experiment involving the measurement of the shear strength of six tin-silver (Sn-3.5Ag) balls soldered onto a Al/Ni/Pd under-bump metal, UBM, using the same RoyceSystem 552 shear tester. One such AgSn micro-balls soldered onto Al/Ni/Pd UBM is shown FIG. 19.

FIG. 20 shows the operation principle of this Royce System 552 shear tester when used to quantify the shear strength of such AgSn micro-balls soldered onto Al/Ni/Pd UBM.

Figure 21:
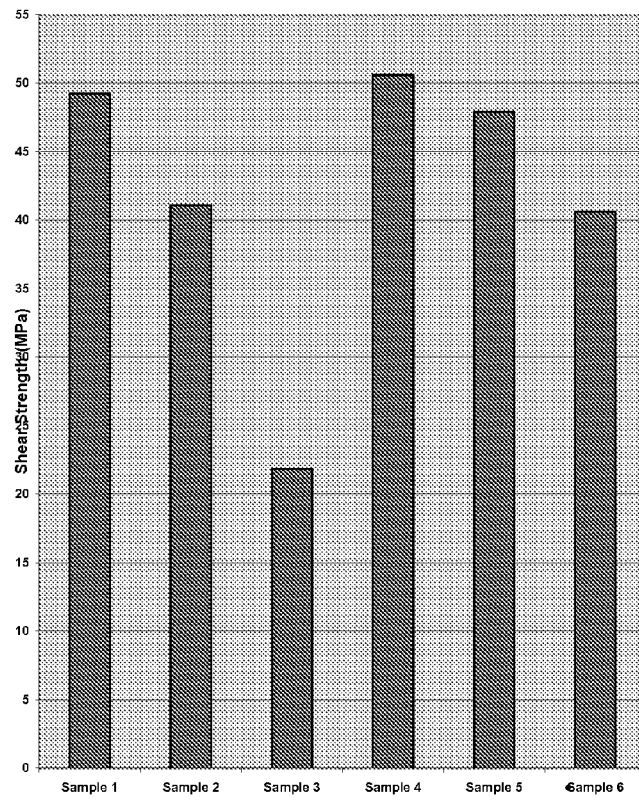
FIG. 21 shows the shear strength of six SnAg lead-free balls soldered over an Al/Ni/Pd under-bump metal layer (Used for comparison with the six transferred protection capsules)

FIG. 21 shows the shear strength measurements for six different Sn-3.5Ag balls soldered over the Al/Ni/Pd UBM. It is clear that the measured shear strength values ranging from 21.8 MPa and 50.6 MPa demonstrate the bond quality of the two seamless interfaces of FIG. 36. Clearly speaking, the transferred protection capsules adhere as much to the MEMS wafers as if they were soldered to a metal base.

The application of the applied force from 5 kN to 20 kN in the Gemini bond station on the effective contact surface of the thousands of spacer rings, represent less that of about 4% of the surface of the 150 mm wafers, thus representing an effective spacer ring contact surface area of about 7.0 cm$^2$. Such an applied 5 kN to 20 kN force on such a small effective surface area of 7.0 cm$^2$ results in an effective applied pressure of about 6.7 MPa to 29 MPa. The result of this simple calculation at 20 kN matches the measured shear strength of about 29 MPa. There must be a relationship between the compression of the mating SU8 surface, the effective surface area of SU8 exposed to the bond surface of the MEMS wafer and the resulting shear strength. Since the adhesion of any interface is directly related to the number of chemical bonds forming this interface, an analysis of the bond and polymerisation mechanisms can provide insights about the reasons for such an impressive adhesion. The following reference describes the SU-8 molecule:

G. T. Paloczi, "Polymer Integrated Optics: Device Architectures and Fabrication Methods", Ph.D. Thesis, California Institute of Technology, Pasadena, California, Defended Apr. 27, 2005

Figure 22:
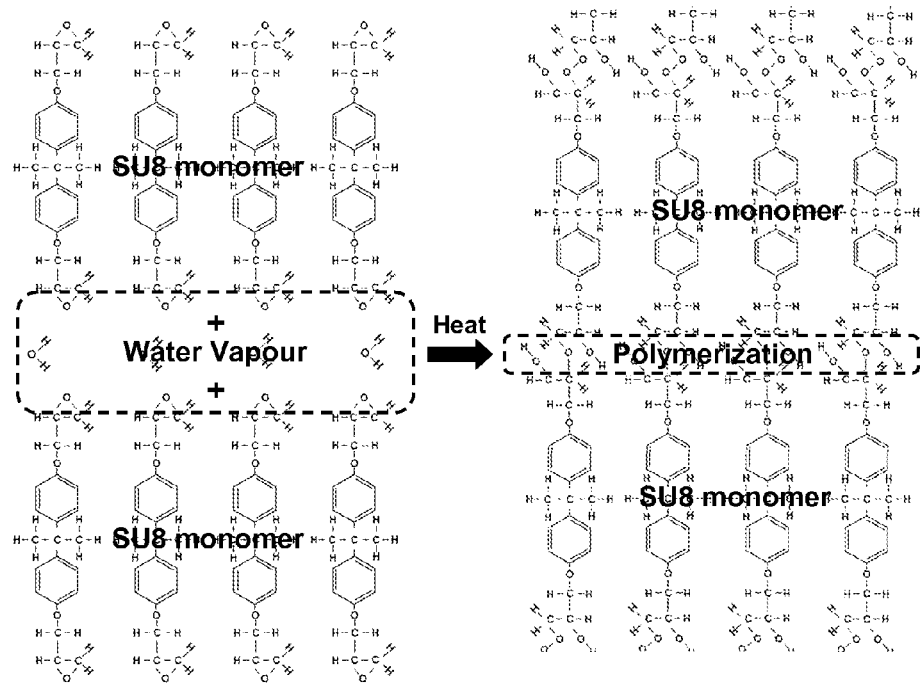
FIG. 22 shows the SU8 heat treatment in presence of water vapour (Causes polymerization of terminal bonds as bridging =C—O—C= bonds).

FIG. 22 shows the chemical reactions involving such polymerization of two SU8 monomers during the heat treatment in presence of water vapour. The side reticulations, produced by the cationic photopolymerization induced by the Lewis acid generated by the photo acid generator, PAG, result in the polymerisation of the epoxy rings and in the densification of the polymer when exposed to water vapour. The SU8-to-SU8 interface is well bonded due to the side polymerisation of the terminal epoxy rings of the SU8 monomers that have been in intimate contact while pressed in the bond equipment. Similarily, the polymerisation is favored when the terminal epoxy rings of the SU8 monomers are exposed to silanol bonds of the bond surface of the MEMS wafer. These permanent =C—O—C= covalent bonds result in the spectacular shear strength observed to be equivalent to the shear strength of metal solders Following this transfer, the MEMS wafer is mounted on frame and diced with a dicing saw to produce thousands of individual devices now free to be picked and placed. A schematic representation of such is shown in FIG. 12.

All references referred to are herein incorporated by reference.

We claim:

1. A method of making a MEMS device, comprising:
depositing a silicon nitride layer onto a silicon carrier wafer;
exposing the silicon nitride layer to anhydrous hydrofluoric acid to transform a surface sublayer of silicon nitride layer into ammonium fluorosilicate;
forming multiple protective capsules on said ammonium fluorosilicate sublayer;
bringing said silicon carrier wafer into contact with a MEMS wafer such that said mutiple protective components are aligned with respective mechanical components formed on the MEMS wafer;
applying pressure to said carrier wafer and said MEMS wafer to bond said protective components to said MEMS wafer; and
subsequently heating the bonded wafers to a temperature sufficient to decompose the ammonium silicate and thereby release the carrier wafer from the protective components, whereby the ammonium silicate sublayer is used as a temporary adhesion layer to permit the transfer of protective components from the carrier wafer to the MEMS wafer.

2. The method of claim 1, wherein the protective components are formed by pattering at least one photopolymer layer.

3. The method of claim 1, wherein the exposure of the silicon nitride layer to anhydrous hydrofluoric acid takes place in a sub-atmospheric pressure mixture of anhydrous hydrofluoric acid and an organic volatile.

4. The method of claim 3, wherein the organic volatile is selected from the group consisting of: methanol, acetone, 1-buthanol, 2-buthanol, 1-propanol and 2-propanol.

5. The method of claim 2, wherein the or each photopolymer layer is a negative tone photopolymer.

6. The method of claim 5, wherein the negative tone photopolymer is an epoxy-like negative tone photopolymer.

7. The method of claim 5, wherein the photopolymer thickness ranges between 5 μm and 500 μm.

8. The method of claim 7, wherein the photopolymer is exposed using a UV source to create the protective components.

9. The method of claim 8, wherein the UV source is highly collimated to achieve high aspect ratio features.

10. The method of claim 9, wherein the exposed photopolymer is subjected to a post-exposure heat treatment not exceeding 99° C.

11. The method of claim 2, wherein the protective components comprise a protective capsule and a sealing ring surrounding the protection capsule and designed to space the protective capsule from moving parts within the MEMS device, and wherein a first layer of photopolymer is applied to the carrier wafer to pattern the protective capsules, and a second layer of photopolymer is applied over the first layer of photopolymer to pattern the sealing ring.

12. The method of claim 11, wherein each photopolymer is patterned by selective exposure to ultraviolet light, and subsequently developed to reveal the protection capsule and sealing ring.

13. The method of claim 12, wherein prior to exposure to ultraviolet light, the photolpolymers are subject to a pre-exposure bake at less than 95° C. for stabilization.

14. The method of claim 11, wherein the silicon nitride layer is exposed to anhydrous hydrofluoric acid at sub-atmospheric pressure.

15. The method of claim 14, wherein the exposure of silicon nitride to anhydrous hydrofluoric acid occurs in the presence of organic volatiles.

16. The method of claim 11, wherein after release of the carrier substrate, the MEMS wafer is subjected to vacuum and heat to polymerize the protective capsules.

* * * * *